United States Patent
Im et al.

(10) Patent No.: US 10,367,123 B2
(45) Date of Patent: Jul. 30, 2019

(54) LIGHT EMITTING DEVICE HAVING A DAM SURROUNDING EACH LIGHT EMITTING REGION AND A BARRIER SURROUNDING THE DAM AND FABRICATING METHOD THEREOF

(71) Applicant: Samsung Display Co., Ltd., Yongin-si, Gyeonggi-do (KR)

(72) Inventors: Hyun Deok Im, Yongin-si (KR); Jong Hyuk Kang, Yongin-si (KR); Dae Hyun Kim, Yongin-si (KR); Joo Yeol Lee, Yongin-si (KR); Hyun Min Cho, Yongin-si (KR)

(73) Assignee: Samsung Display co., Ltd. (KR)

( * ) Notice: Subject to any disclaimer, the term of this patent is extended or adjusted under 35 U.S.C. 154(b) by 0 days.

(21) Appl. No.: 15/813,807

(22) Filed: Nov. 15, 2017

(65) Prior Publication Data

US 2018/0138157 A1 May 17, 2018

(30) Foreign Application Priority Data

Nov. 15, 2016 (KR) .......................... 10-2016-0152148

(51) Int. Cl.
*H01L 33/52* (2010.01)
*H01L 33/56* (2010.01)
(Continued)

(52) U.S. Cl.
CPC .......... *H01L 33/52* (2013.01); *H01L 25/0753* (2013.01); *H01L 33/48* (2013.01); *H01L 33/483* (2013.01); *H01L 33/486* (2013.01); *H01L 33/56* (2013.01); *H01L 33/58* (2013.01); *H01L 25/167* (2013.01); *H01L 27/1214* (2013.01); *H01L 33/20* (2013.01); *H01L 33/32* (2013.01); *H01L 33/54* (2013.01); *H01L 33/62* (2013.01);
(Continued)

(58) Field of Classification Search
CPC ......... H01L 33/48; H01L 33/54; H01L 33/56; H01L 33/483; H01L 33/486; H01L 25/0753; H01L 33/382; H01L 33/385; H01L 33/387
See application file for complete search history.

(56) References Cited

U.S. PATENT DOCUMENTS 9,368,549 B1 * 6/2016 Oraw .................... H01L 27/156
2011/0157891 A1 * 6/2011 Davis ................ B29C 45/14467
362/244
(Continued)

FOREIGN PATENT DOCUMENTS

KR 10-1490758 B1 2/2015

*Primary Examiner* — Michael Jung
(74) *Attorney, Agent, or Firm* — Innovation Counsel LLP

(57) ABSTRACT

A light emitting device includes: a base substrate; a plurality of unit regions provided on the base substrate; a barrier disposed at a boundary of the unit regions to surround each of the unit regions; a dam disposed in each of the unit regions to be spaced apart from the barrier; a first electrode provided in each of unit light emitting regions surrounded by the dam; a second electrode disposed in each of the unit light emitting regions, the second electrode of which at least one region is provided opposite to the first electrode; and one or more LEDs provided in each of the unit light emitting regions, the one or more LEDs being electrically connected between the first electrode and the second electrode.

21 Claims, 14 Drawing Sheets

(51) Int. Cl.
*H01L 33/48* (2010.01)
*H01L 25/075* (2006.01)
*H01L 33/58* (2010.01)
H01L 25/16 (2006.01)
H01L 27/12 (2006.01)
H01L 33/20 (2010.01)
H01L 33/32 (2010.01)
H01L 33/54 (2010.01)
H01L 33/62 (2010.01)

(52) U.S. Cl.
CPC ............... *H01L 2933/005* (2013.01); *H01L 2933/0033* (2013.01); *H01L 2933/0091* (2013.01)

(56) References Cited

U.S. PATENT DOCUMENTS

| | | | |
|---|---|---|---|
| 2012/0193651 A1* | 8/2012 | Edmond | H01L 25/0753 257/88 |
| 2012/0326193 A1* | 12/2012 | Park | H01L 33/52 257/98 |
| 2013/0200400 A1* | 8/2013 | Jang | H01L 25/0753 257/88 |
| 2014/0091344 A1* | 4/2014 | Wang | H01L 33/54 257/98 |
| 2015/0349218 A1* | 12/2015 | Reiherzer | H01L 33/56 257/88 |
| 2016/0148911 A1 | 5/2016 | Do | |
| 2016/0365396 A1* | 12/2016 | Jiao | H01L 27/3246 |
| 2018/0061728 A1* | 3/2018 | Chen | H01L 23/3192 |

* cited by examiner

LIGHT EMITTING DEVICE HAVING A DAM SURROUNDING EACH LIGHT EMITTING REGION AND A BARRIER SURROUNDING THE DAM AND FABRICATING METHOD THEREOF

RELATED APPLICATIONS

The present application claims priority to Korean Patent Application No. 10-2016-0152148, filed on Nov. 15, 2016, in the Korean Intellectual Property Office, the entire disclosure of which is incorporated by reference herein.

BACKGROUND

1. Field

An aspect of the present disclosure relates to a light emitting device and a fabricating method thereof.

2. Description of the Related Art

Light emitting diodes (hereinafter, abbreviated as LEDs) exhibit relatively satisfactory durability even in poor environmental conditions and have excellent performance in terms of lifespan and luminance. Recently, studies for applying such LEDs to various light emitting devices have been actively conducted.

As a part of such studies, there has been a technique for fabricating a micro LED that is small to a degree of micro or nano scale using an inorganic crystal structure, e.g., a structure in which a nitride based semiconductor is grown. For example, the LED may be fabricated in a size small enough to constitute a pixel of a self-luminescent display panel, and the like.

SUMMARY

Embodiments provide a light emitting device that includes a LED and has uniform luminance characteristics, and a fabricating method of the light emitting device.

According to an aspect of the present disclosure, there is provided a light emitting device including: a base substrate; a plurality of unit regions provided on the base substrate; a barrier disposed at a boundary of the unit regions to surround each of the unit regions; a dam disposed in each of the unit regions to be spaced apart from the barrier; a first electrode provided in each of unit light emitting regions surrounded by the dam; a second electrode disposed in each of the unit light emitting regions, the second electrode of which at least one region is provided opposite to the first electrode; and one or more LEDs provided in each of the unit light emitting regions, the one or more LEDs being electrically connected between the first electrode and the second electrode.

The light emitting device may include a plurality of pixels provided in the unit regions.

At least a surface of the dam may have hydrophilicity.

At least a surface of the barrier may have hydrophobicity.

A height of the dam may be equal to or greater than that of the barrier.

The dams disposed in the respective unit regions may have the same height.

The dam may be configured as a closed sidewall of which at least one region has a flat or curved surface.

The LEDs may be bar type LEDs, a length of each of the bar type LEDs may be equal to or greater than a shortest distance between the first electrode and the second electrode, and one end and the other end of the bar type LEDs may be electrically in contact with the first electrode and the second electrode, respectively.

The light emitting device may further include a filler provided in each of the unit regions to fill in at least the dam, the filler including a plurality of scattering particles.

A plurality of dams spaced apart from one another may be provided in each of the unit regions.

According to an aspect of the present disclosure, there is provided a method of fabricating a light emitting device, the method including: preparing a base substrate, the base substrate including unit regions and unit light emitting regions; forming a first electrode and a second electrode in each of the unit light emitting regions; forming a dam surrounding each of the unit light emitting regions and a barrier surrounding the dam, the barrier being spaced a predetermined distance apart from the dam; and coating an LED solution in which LEDs are dispersed in the each of the unit regions to fill in at least the unit light emitting regions. The LEDs may be bar type LEDs.

In the coating in the coating of the LED solution, the LED solution of which amount is equal to or greater than a capacity of the dam may be coated in each of the unit regions.

In the coating of the LED solution, the LED solution of which amount is equal to or less than a total accommodation amount by the dam and the barrier may be coated in each of the unit regions.

The forming of the dam may include: forming a base pattern of the dam by coating and patterning at least one of one or more inorganic layers and one or more organic layers on the base substrate; and performing hydrophilic processing on a surface of the base pattern.

The forming of the base pattern may include forming at least one inorganic layer on the base substrate using a sputtering process.

The forming of the barrier may include: forming a base pattern of the barrier by coating and patterning at least one of one or more inorganic layers and one or more organic layers on the base substrate; and performing hydrophobic processing on a surface of the base pattern.

The forming of the dam and the forming of the barrier may be sequentially performed.

The method may further include inducing an electric field between the first electrode and the second electrode while the coating the LED solution or after the coating the LED solution.

The method may further include removing a solvent of the LED solution.

The method may further include coating a filler including a plurality of scattering particles in each of the unit regions.

In the coating of the filler, the filler of which amount is equal to or greater than the capacity of at least the dam may be coated in each of the unit regions.

According to an aspect of the present disclosure, there is provided a light emitting display device including: a base substrate; a pixel region provided on the base substrate; a barrier surrounding the pixel region; a dam disposed in the pixel region to be spaced apart from the barrier; a first electrode provided in a unit light emitting region surrounded by the dam; a second electrode provided in the unit light emitting region, the second electrode of which at least one region is opposite to the first electrode; and one or more LEDs disposed in the unit light emitting region, the one or more LEDs being electrically connected between the first electrode and the second electrode.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
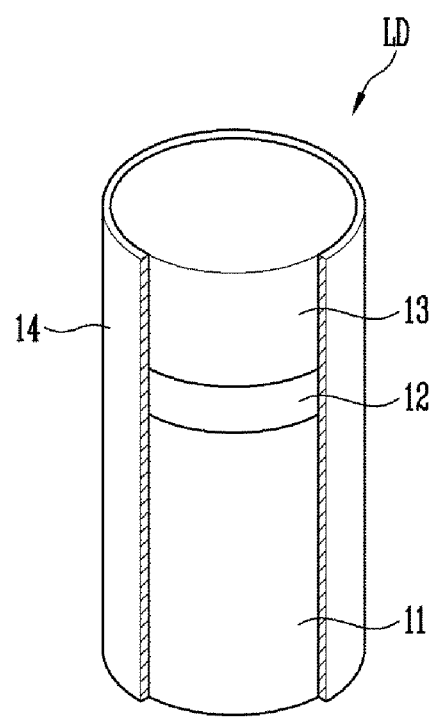
FIG. 1 is a perspective view illustrating a bar type LED according to an embodiment of the present disclosure.

Hereinafter, exemplary embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art. In the entire specification, when an element is referred to as being "connected" or "coupled" to another element, it can be directly connected or coupled to the another element or be indirectly connected or coupled to the another element with one or more intervening elements interposed therebetween.

Meanwhile, in the following embodiments and the attached drawings, elements not directly related to the present disclosure are omitted from depiction, and dimensional relationships among individual elements in the attached drawings are illustrated only for ease of understanding but not to limit the actual scale. It should note that in giving reference numerals to elements of each drawing, like reference numerals refer to like elements even though like elements are shown in different drawings.

According to an embodiment of the present disclosure, a light emitting device is not limited to the embodiments disclosed herein but may be implemented into different forms using different light emitting sources such as bar type LEDs and flip chip LEDs. Disclosed herein is an embodiment in which a bar type LED LD is used as a light emitting source. A bar type LED LD will be first described, and a light emitting device to which the bar type LED LD is applied will be then described.

FIG. 1 is a perspective view illustrating a bar type LED LD according to an embodiment of the present disclosure. According to the embodiment of the present disclosure, a cylindrical bar type LED LD has been illustrated in FIG. 1, but the present disclosure is not limited thereto.

Referring to FIG. 1, the bar type LED LD according to the embodiment of the present disclosure includes first and second conductive semiconductor layers 11 and 13 and an active layer 12 interposed between the first and second conductive semiconductor layers 11 and 13. For example, the bar type LED LD may be implemented as a stack structure in which the first conductive semiconductor layer 11, the active layer 12, and the second conductive semiconductor layer 13 are sequentially stacked. In some embodiments, the bar type LED LD may further include an insulating film 14. In addition, the bar type LED LD may further include a first electrode (not shown) and a second electrode (not shown).

According to the embodiment of the present disclosure, the bar type LED LD extends along one direction. If it is assumed that the extending direction of the bar type LED LD is a length direction, the bar type LED LD has a first end portion and a second end portion. In an embodiment of the present disclosure, one of the first and second conductive semiconductor layers 11 and 13 is disposed at the first end portion, and the other of the first and second conductive semiconductor layers 11 and 13 is disposed at the second end portion.

In some embodiments, the bar type LED LD may be provided in a cylindrical shape as shown in FIG. 1, but the shape of the bar type LED LD is not limited thereto. Here, the term "bar type" includes a rod-like shape or bar-like shape, which is long in its length direction (i.e., its aspect ratio is greater than 1), such as a cylindrical column or a polygonal column. For example, the bar type LED LD may have a length greater than a diameter thereof.

The bar type LED LD may be fabricated small enough to have a diameter and/or a length, for example, to a degree of micro or nano scale. However, the size of the bar type LED LD according to the embodiment of the present disclosure is not limited thereto. For example, the size of the bar type LED LD may be changed to correspond to required conditions of a light emitting device to which the bar type LED LD is applied.

The first conductive semiconductor layer 11 may include, for example, at least one n-type semiconductor layer. For example, the first conductive semiconductor layer 11 may include at least one semiconductor material selected from InAlGaN, GaN, AlGaN, InGaN, AlN, and InN, and may include a semiconductor layer doped with a first conductive dopant such as Si, Ge, or Sn. The material constituting the first conductive semiconductor layer 11 is not limited thereto, and various materials may be included in the first conductive semiconductor layer 11.

The active layer 12 is formed on the first conductive semiconductor layer 11, and may be formed in a single or multiple quantum well structure. In some embodiments, a clad layer (not shown) doped with a conductive dopant may be formed over and/or under the active layer 12. For example, the clad layer may be implemented as an AlGaN layer or InAlGaN layer. In addition, it will be apparent that a material such as AlGaN or AlInGaN may also be used for the active layer 12. If an electric field having a predetermined voltage or more is applied to both ends of the bar type LED, the bar type LED emits light as electron-hole pairs are combined in the active layer 12.

The second conductive semiconductor layer 13 is formed on the active layer 12, and may include a semiconductor layer having a different type from the first conductive semiconductor layer 11. For example, the second conductive semiconductor layer 13 may include at least on p-type semiconductor layer. For example, the second conductive semiconductor layer 13 may include at least one semiconductor material selected from InAlGaN, GaN, AlGaN, InGaN, AlN, and InN, and may include a semiconductor layer doped with a second conductive dopant such as Mg. The material constituting the second conductive semiconductor layer 13 is not limited thereto, and various materials may be included in the second conductive semiconductor layer 13.

Meanwhile, in some embodiments, in addition to the first conductive semiconductor layer 11, the active layer 12, and the second conductive semiconductor layer 13, which are described above, the bar type LED LD may further include a phosphor layer, an active layer, a semiconductor layer, and/or an electrode layer, which are formed over and/or under each of the first conductive semiconductor layer 11, the active layer 12, and/or the second conductive semiconductor layer 13. For example, the bar type LED LD may further include a first electrode (not shown) and a second electrode (not shown). The first electrode may be electrically connected to the first conductive semiconductor layer 11, and the second electrode may be electrically connected to the second conductive semiconductor layer 13. For example, the first electrode may be electrically connected to the bar type LED LD through one surface of the first conductive semiconductor layer 11 (e.g., a lower surface of the bar type LED LD, which is not covered by the insulating film 14 in FIG. 1), and the second electrode may be electrically connected to the bar type LED LD through one surface of the second conductive semiconductor layer 13 (e.g., an upper surface of the bar type LED LD, which is not covered by the insulating film 14 in FIG. 1). In some embodiments, a conductive contact layer (not shown) may be further provided between the first electrode and the first conductive semiconductor layer 11 and/or between the second electrode and the second conductive semiconductor layer 13.

In some embodiments, the bar type LED LD may further include the insulating film 14, but the present disclosure is not limited thereto. That is, the insulating film 14 may be omitted.

In some embodiments, the insulating film 14 may be provided to cover at least one region of the first conductive semiconductor layer 11, the active layer 12, and the second conductive semiconductor layer 13. For example, the insulating film 14 may be provided to expose at least portions of both the end portions of the bar type LED LD. FIG. 1 is a state in which a portion of the insulating film 14 is removed for convenience of description. In FIG. 1, it has been illustrated that, as a side portion of the insulating film 14 is removed, portions of the first conductive semiconductor layer 11, the active layer 12, and the second conductive semiconductor layer 13 are exposed. However, in the actual bar type LED LD, the entire side surface of the cylindrical column may be surrounded by the insulating film 14. In other embodiments, the insulating film 14 may expose at least one side region of the first conductive semiconductor layer 11 and/or the second conductive semiconductor layer 13.

The insulating film 14 is formed to surround at least one portion of outer circumferential surfaces of the first conductive semiconductor layer 11, the active layer 12, and/or the second conductive semiconductor layer 13. For example, the insulating film 14 may be formed to at least surround the outer circumferential surface of the active layer 12. In some embodiments, the insulating film 14 may be formed of a transparent insulating material. For example, the insulating film 14 may include at least one selected from the group consisting of $SiO_2$, $Si_3N_4$, $Al_2O_3$, and $TiO_2$, but the present disclosure is not limited thereto. That is, various materials having insulating properties may be used.

In a non-restrictive embodiment, the insulating film 14 may be made of a hydrophobic material, or a hydrophobic film made of a hydrophobic material may be further provided on the insulating film 14. In some embodiments, the hydrophobic material may be a material containing fluorine to exhibit hydrophobicity. In some embodiments, the hydrophobic material may be applied in the form of a self-assembled monolayer (SAM) to the bar type LED LD. In this case, the hydrophobic material may include octadecyltrichlorosilane, fluoroalkyltrichlorosilane, perfluoroalkyltriethoxysilane, and the like. In addition, the hydrophobic material may be a commercialized fluorine-containing material such as Teflon™ or Cytop™, or a material corresponding thereto.

If the insulating film 14 is formed, the active layer 12 can be prevented from being short-circuited with the first electrode (not shown) and/or the second electrode (not shown). Further, as the insulating film 14 is formed, a surface defect of the bar type LED LD can be minimized, thereby improving lifespan and luminous efficiency. Furthermore, when a plurality of bar type LEDs LD are densely arranged, the insulating film 14 can prevent an undesired short circuit that may occur between the bar type LEDs LD.

Additionally, if the insulating film 14 is made of a hydrophobic material or if a hydrophobic film is provided on the insulating film 14, when an LED solution containing bar type LEDs LD is coated (or dropped), the bar type LEDs LD may be relatively uniformly distributed in the LED solution. Thus, the bar type LEDs LD can be uniformly coated or distributed in each of unit regions constituting the light emitting device.

The above-described bar type LED LD may be used as a light emitting source for various light emitting devices. For example, the bar type LED LD may be used as a light emitting source for lighting devices or self-luminescent display panels.

Figure 2:
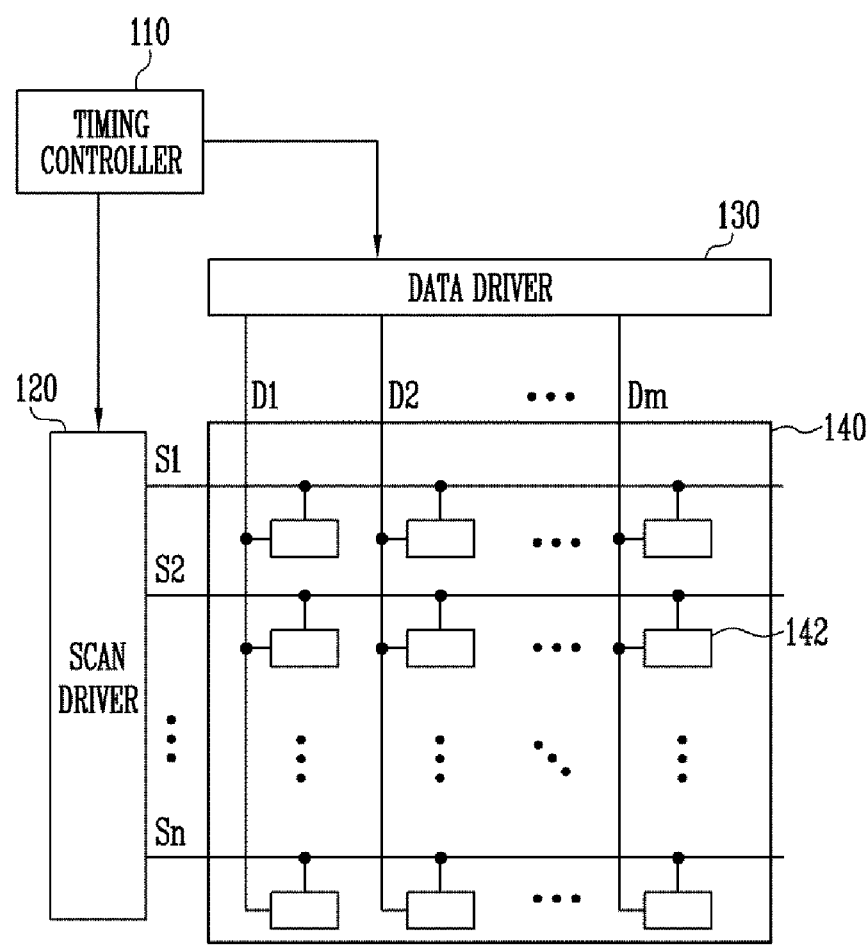
FIG. 2 is a structural diagram illustrating a light emitting device according to an embodiment of the present disclosure.

FIG. 2 is a structural diagram illustrating a light emitting device according to an embodiment of the present disclosure. In some embodiments, in FIG. 2, a light emitting display device has been illustrated as an example of light emitting devices using bar type LEDs LD, but the light emitting device according to the present disclosure is not limited to the light emitting display device. For example, the light emitting device according to the present disclosure may be a different type of light emitting device such as a lighting device.

Referring to FIG. 2, the light emitting device according to the embodiment of the present disclosure includes a timing controller 110, a scan driver 120, a data driver 130, and a light emitting unit 140. When the light emitting device is a light emitting display device like this embodiment, the light emitting unit 140 may mean the entire pixel region implemented on a display panel.

The timing controller 110 receives various control signals and image data, which are required to drive the light emitting unit 140, from an outside (e.g., a system for transmitting image data). The timing controller 110 realigns the received image data and transmits the realigned image data to the data driver 130. Also, the timing controller 110 generates scan control signals and data control signals, which are required to drive the respective scan and data drivers 120 and 130, and transmits the generated scan and data control signals to the respective scan and data drivers 120 and 130.

The scan driver 120 receives a scan control signal supplied from the timing controller 110, and generates a scan signal corresponding to the scan control signal. The scan signal generated by the scan driver 120 is supplied to unit regions (e.g., pixels) 142 through scan lines S1 to Sn.

The data driver 130 receives a data control signal and the realigned image data, supplied from the timing controller 110, and generates a data signal corresponding to the data control signal and the realigned image data. The data signal generated by the data driver 130 is output to data lines D1 to Dm. The data signal output to the data lines D1 to Dm is input to unit regions 142 on a horizontal pixel line selected by the scan signal.

The light emitting unit 140 may include a plurality of pixels 142 connected to the scan lines S1 to Sn and the data lines D1 to Dm. In some embodiments, each of the pixels 142 may include one or more bar type LEDs LD as shown in FIG. 1. The pixels 142 selectively emit light, corresponding to a data signal input from the data lines D1 to Dm when a scan signal is supplied from the scan lines S1 to Sn. For example, each of the pixels 142 may emit light with a luminance corresponding to the input data signal during each frame period. A pixel 142 receiving a data signal corresponding to a black luminance does not emit light during a corresponding frame period, thereby displaying black. When the light emitting unit 140 is a pixel unit (display area) of an active light emitting display panel, the light emitting unit 140 may be driven by being further supplied with first and second pixel power sources as well as the scan and data signals.

FIGS. 3A to 3E are circuit diagrams illustrating a unit region of a light emitting device according to an embodiment of the present disclosure, which illustrate examples of a pixel constituting a passive light emitting display panel. For convenience, a jth (j is a natural number) pixel on an ith (i is a natural number) horizontal pixel line is illustrated in FIGS. 3A to 3E. As a non-restrictive example related to the pixel shown in FIGS. 3A to 3E, the pixel may be one of red, green, blue, and white pixels.

Figure 3A:
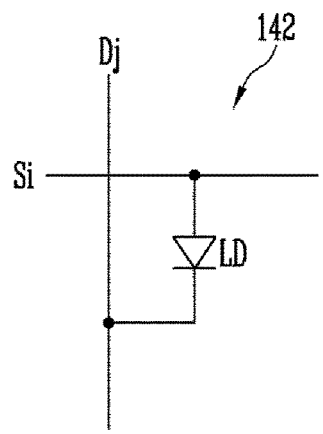
FIGS. 3A, 3B, 3C, 3D and 3E are circuit diagrams illustrating a unit region of a light emitting device according to an embodiment of the present disclosure, which illustrate examples of a pixel constituting a passive light emitting display panel.

Referring to FIG. 3A, the pixel 142 includes a bar type LED LD connected between a scan line Si and a data line Dj. In some embodiments, a first electrode (e.g., an anode electrode) of the bar type LED LD may be connected to the scan line Si, and a second electrode (e.g., a cathode electrode) of the bar type LED LD may be connected to the data line Dj. When a voltage equal to or greater than a threshold voltage is applied between the first electrode and the second electrode, the bar type LED LD emits light with a luminance corresponding to the magnitude of the applied voltage. That is, the voltage of a scan signal applied to the scan line Si and/or a data signal applied to the data line Dj is adjusted, thereby controlling the light emission of the pixel 142.

Figure 3B:
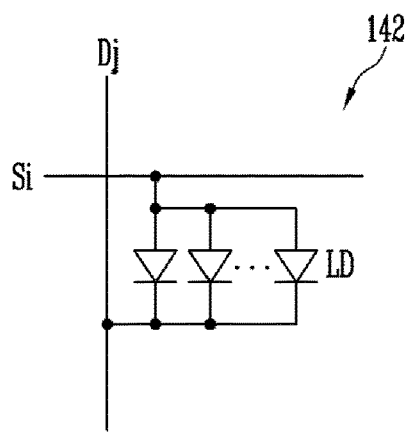

Referring to FIG. 3B, in some embodiments, the pixel 142 may include two or more bar type LEDs LD connected in parallel. In this case, the luminance of the pixel 142 may correspond to the sum of brightnesses of a plurality of LEDs LD constituting the pixel 142. If the pixel 142 includes a plurality of bar type LEDs LD, particularly, a large number of bar type LEDs LD, although a defect occurs in some bar type LEDs LD, the remaining bar type LEDs LD may emit light, thus, defect can be prevented from causing a defect of the pixel 142 itself.

Figure 3C:
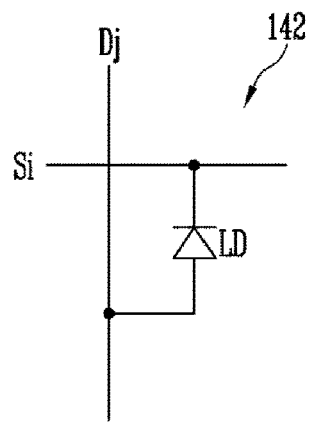

Referring to FIG. 3C, in some embodiments, the connecting direction of the bar type LEDs LD provided in the pixel 142 may be altered. For example, the first electrode (anode electrode) of the bar type LED LD may be connected to the data line Dj, and the second electrode (cathode electrode) of the bar type LED nLED may be connected to the scan line Si. The direction of a voltage applied between the scan line Si and the data line Dj in the embodiment of FIG. 3A and the direction of a voltage applied between the scan line Si and the data line Dj in the embodiment of FIG. 3C may be opposite to each other.

Figure 3D:
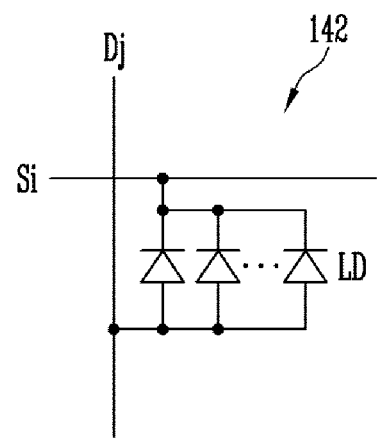

Referring to FIG. 3D, the pixel 142 according the embodiment of FIG. 3C may also include two or more bar type LEDs LD connected in parallel.

Figure 3E:
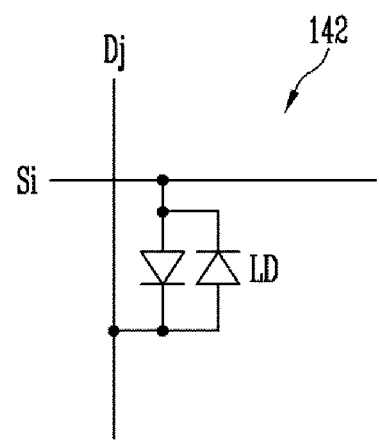

Referring to FIG. 3E, in some embodiments, the pixel 142 may include a plurality of bar type LEDs LD connected in different directions. For example, the pixel 142 may include one or more bar type LEDs LD each having the first electrode (anode electrode) connected to the scan line Si and the second electrode (cathode electrode) connected to the data line Dj, and one or more bar type LEDs LD each having the first electrode (anode electrode) connected to the data line Dj and the second electrode (cathode electrode) connected to the san line Si.

In some embodiments, the pixel 142 of FIG. 3E may be DC driven or AC driven. When the pixel 142 of FIG. 3E is DC driven, forward connected bar type LEDs LD may emit light, and reverse connected LEDs LD may not emit light. Meanwhile, when the pixel 142 of FIG. 3E is AC driven, forward connected bar type LEDs LD may emit light according to the direction of an applied voltage. That is, when the pixel 142 of FIG. 3E is AC driven, the bar type LEDs LD included in the pixel 142 may alternately emit light according to the direction of the applied voltage.

Figure 4A:
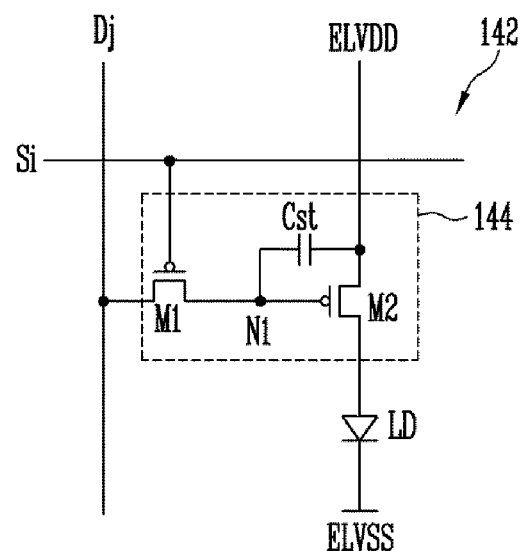
FIGS. 4A, 4B and 4C are circuit diagrams illustrating a unit region of a light emitting device according to an embodiment of the present disclosure, which illustrates examples of a pixel constituting an active light emitting display panel.
Figure 4B:
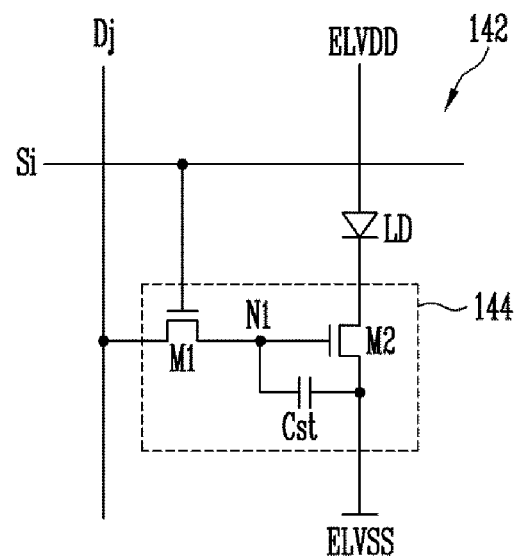
Figure 4C:
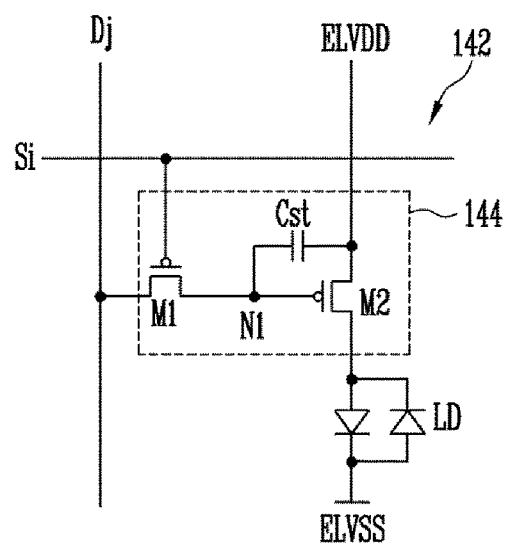

FIGS. 4A to 4C are circuit diagrams illustrating a unit region of a light emitting device according to an embodiment of the present disclosure, which illustrates examples of a pixel constituting an active light emitting display panel. In FIGS. 4A to 4C, components similar or identical to those of FIGS. 3A to 3E are designated by like reference numerals, and their detailed descriptions will be omitted.

Referring to FIG. 4A, the pixel 142 includes one or more bar type LEDs LD and a pixel circuit 144 connected thereto.

A first electrode (e.g., an anode electrode) of the bar type LED LD is connected to a first pixel power source ELVDD via the pixel circuit 144, and a second electrode (e.g., a cathode electrode) of the bar type LED LD is connected to a second pixel power source ELVSS. The first pixel power source ELVDD and the second pixel power source ELVSS may have potentials different from each other. For example, the second pixel power source ELVSS may have a potential lower by a threshold voltage or more of the bar type LED LD than that of the first pixel power source ELVDD. Each of the bar type LEDs LD emits light with a luminance corresponding to a driving current controlled by the pixel circuit 144.

Meanwhile, although an embodiment in which only one bar type LED LD is included in the pixel 142 has been disclosed in FIG. 4A, the present disclosure is not limited thereto. For example, the pixel 142 may include a plurality of bar type LEDs LD connected in parallel.

In some embodiments, the pixel circuit 144 may include first and second transistors M1 and M2 and a storage capacitor Cst. However, the structure of the pixel circuit 144 is not limited to the embodiment shown in FIG. 4A.

A first electrode of the first transistor (switching transistor) M1 is connected to a data line Dj, and a second electrode of the first transistor M1 is connected to a first node N1. Here, the first and second electrodes of the first transistor M1 are electrodes different from each other. For example, if the first electrode is a source electrode, the second electrode may be a drain electrode. In addition, a gate electrode of the first transistor M1 is connected to a scan line Si. The first transistor M1 is turned on when a scan signal having a voltage (e.g., a gate-on voltage of a low level) at which the first transistor M1 can be turned on is supplied from the scan line Si, to allow the data line Dj and the first node N1 to be electrically connected to each other. At this time, a data signal of a corresponding frame is supplied to the data line Dj. Accordingly, the data signal is transmitted to the first node N1. The data signal transmitted to the first node N1 is charged in the storage capacitor Cst.

A first electrode of the second transistor (driving transistor) M2 is connected to the first pixel power source ELVDD, and a second electrode of the second transistor M2 is connected to the first electrode of the bar type LED LD. In addition, a gate electrode of the second transistor M2 is connected to the first node N1. The second transistor M2 controls the amount of driving current supplied to the bar type LED LD, corresponding to a voltage of the first node N1.

One electrode of the storage capacitor Cst is connected to the first pixel power source ELVDD, and the other electrode of the storage capacitor Cst is connected to the first node N1. The storage capacitor Cst charges a voltage corresponding to the data signal supplied to the first node N1, and maintains the charged voltage until a data signal of a next frame is supplied.

For convenience, the pixel circuit 144 having a relatively simple structure including the first transistor M1 for transmitting a data signal to the inside of the pixel 142, the storage capacitor Cst for storing the data signal, and the second transistor M2 for supplying, to the bar type LED LD, a driving current corresponding to the data signal has been illustrated in FIG. 4A. However, the present disclosure is not limited thereto, and the structure of the pixel circuit 144 may be variously modified and implemented. For example, it will be apparent that the pixel circuit 144 may further include other circuit elements such as at least one transistor for compensating for a threshold voltage of the second transistor M2, at least one transistor for initializing a voltage of the first node N1 or a voltage applied to one electrode of the bar type LED LD, and/or at least one transistor for controlling a light emission time, or a boosting capacitor for boosting the voltage of the first node N1.

In FIG. 4A, all of the transistors, e.g., both of the first and second transistors M1 and M2, which are included in the pixel circuit 144, are illustrated as p-type transistors, but the present disclosure is not limited thereto. That is, at least one of the transistors M1 and M2 included in the pixel circuit 144 may be replaced with an n-type transistor.

Referring to FIG. 4B, in some embodiments, the first and second transistors M1 and M2 may be implemented as n-type transistors. The configuration or operation of the pixel circuit 144 shown in FIG. 4B is similar to that of the pixel circuit 144 of FIG. 4A, except that the connecting positions of some components are changed due to a change in transistor type. Therefore, detailed description of the pixel circuit 144 of FIG. 4B will be omitted.

Referring to FIG. 4C, in some embodiments, the pixel 142 may include a plurality of bar type LEDs LD connected in different directions. In this case, the pixel 142 may be DC driven or AC driven. This has already been described in FIG. 3E, and therefore, its detailed description will be omitted.

Figure 5:
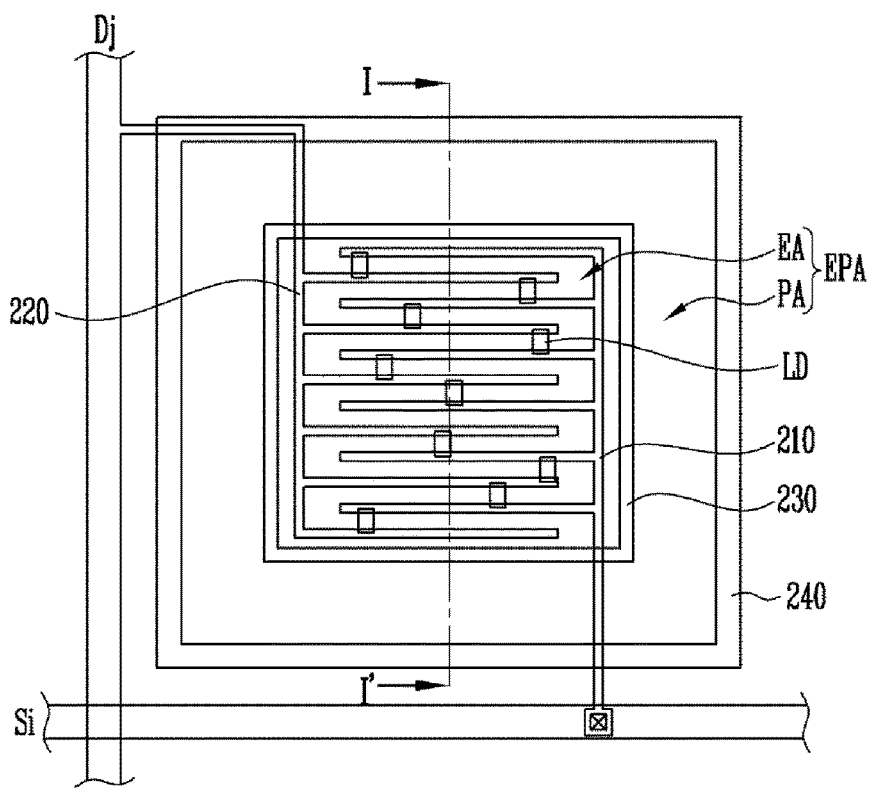
FIG. 5 is a plan view illustrating a unit region of a light emitting device according to an embodiment of the present disclosure, which illustrates an individual pixel region.
Figure 6:
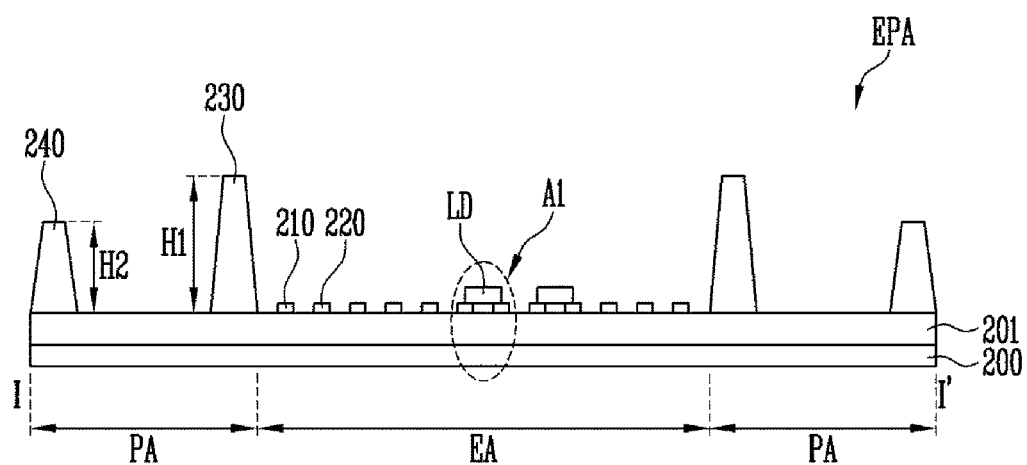
FIG. 6 is a sectional view taken along line I-I' of FIG. 5.
Figure 7:
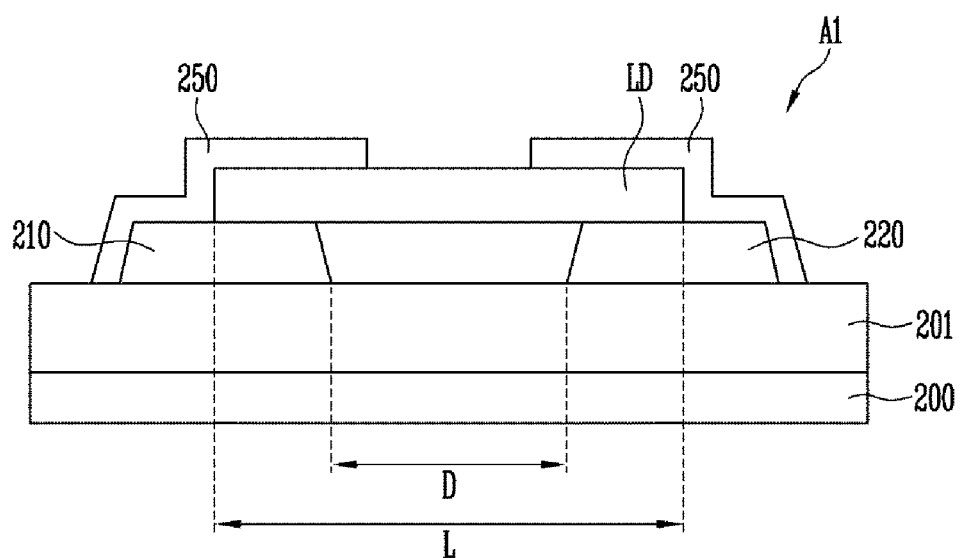
FIG. 7 is a sectional view illustrating one region (A1 region) of FIG. 6.
Figure 8:
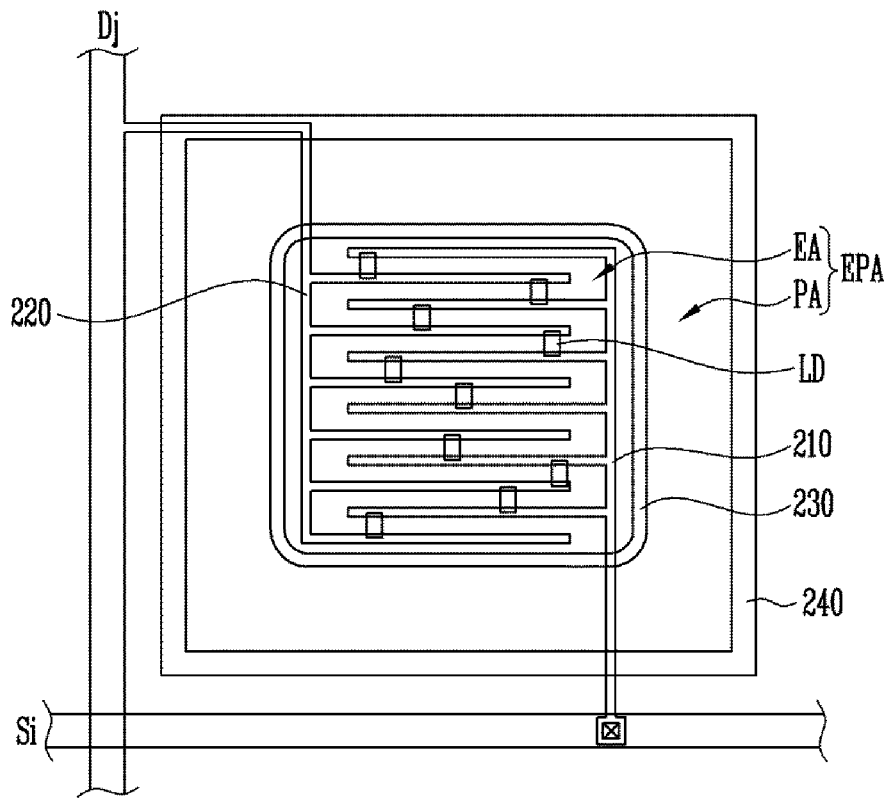
FIG. 8 is a plan view illustrating a unit region of a light emitting device according to an embodiment of the present disclosure, which illustrates an individual pixel region.

FIG. 5 is a plan view illustrating a unit region of a light emitting device according to an embodiment of the present disclosure, which illustrates an individual pixel region EPA. FIG. 6 is a sectional view taken along line I-I' of FIG. 5. FIG. 7 is a sectional view illustrating one region (A1 region) of FIG. 6. FIG. 8 is a plan view illustrating a unit region of a light emitting device according to an embodiment of the present disclosure, which illustrates an individual pixel region EPA. FIG. 8 illustrates a modification of FIG. 5.

For convenience, in FIGS. 5 to 8, a scan line Si and a data line Dj are arranged at the outside of the individual pixel region EPA, but the present disclosure is not limited thereto. For example, at least one region of the scan line Si and/or the data line Dj may overlap with a barrier 240 that defines each pixel region EPA, or may be disposed inside each pixel region EPA.

Referring to FIG. 5, the unit region according to the embodiment of the present disclosure may be, for example, an individual pixel region EPA in which each of the pixels 142 constituting the light emitting unit 140 shown in FIG. 2 is provided. That is, the light emitting device according to the embodiment of the present disclosure may be a light emitting display device including a plurality of individual pixel regions EPA shown in FIG. 5 and the pixel 142 shown in FIGS. 2 to 4C may be provided in each pixel region EPA. However, the present disclosure is not limited thereto, and it will be apparent that the present disclosure may be applied to other light emitting devices as well as the light emitting display device.

In some embodiments, each pixel region EPA may be disposed in a region defined by a corresponding scan line Si and a scan line adjacent to the corresponding scan line Si and a corresponding data line Dj and a data line adjacent to the corresponding data line Dj. One or more unit light emitting regions EA may be defined in the pixel region EPA, and a peripheral region PA may be defined at the periphery of the unit light emitting region EA. That is, in some embodiments, the unit light emitting region EA may be an effective light emitting region of the individual pixel region EPA, and the peripheral region PA may be the remaining region of the individual pixel region EPA which surrounds the unit light emitting region EA.

One or more first electrodes 210 and one or more second electrodes 220 are provided in each pixel region EPA. In some embodiments, the first electrode 210 and the second electrode 220 may be disposed to form a pair such that at least one region of the first electrode 210 and at least one region of the second electrode 220 are opposite to each other, particularly in the unit light emitting region EA.

In some embodiments, the first electrode 210 and the second electrode 220, as shown in FIGS. 6 and 7, may be disposed in the same layer on a base substrate 200 to be spaced apart from each other. For example, the first and second electrodes 210 and 220 may be alternately disposed to be spaced apart from each other at the same height (or at the same level) with respect to an upper surface of the base substrate 200. However, the present disclosure is not necessarily limited thereto. For example, the first and second electrodes 210 and 220 may be disposed in layers different from each other. The first electrode 210 and the second electrode 220 may be formed of the same material, for example, a data metal forming the data line Dj or a gate metal forming the scan line Si.

In some embodiments, one or more insulating layers 201 may be provided between the base substrate 200 and the first and second electrodes 210 and 220. In some embodiments, the insulating layer 201 may be a buffer layer that forms a planarized surface on the base substrate 200 and blocks an impurity element from penetrating through the base substrate 200. The insulating layer may include an oxide layer or nitride layer such as $SiO_x$ or $SiN_x$, but the present disclosure is not limited thereto. Alternately, in other embodiments, the insulating layer 201 may be omitted.

In an embodiment of the present disclosure, the shape of the first electrode 210 and the second electrode 220 is not particularly limited. That is, the first electrode 210 and the second electrode 220 may be implemented in various shapes. For example, the first electrode 210 and the second electrode 220, as shown in FIGS. 5 to 7, may have a structure in which the first electrode 210 and the second electrode 220 are disposed to be spaced apart from each other on the same plane, and each of the first electrode 210 and the second electrode 220 branches off into a plurality of electrode lines in one region such that the electrode lines of the first electrode 210 and the second electrode 220 are alternately disposed. Alternatively, the first electrode 210 and the second electrode 220 may be respectively implemented in vortex shapes disposed to be spaced apart at positions corresponding to each other. Alternatively, the first electrode 210 and the second electrode 220 may be respectively implemented in polygonal shapes disposed in parallel to each other to be spaced apart at a predetermined distance or more, e.g., rectangular bar shapes parallel to each other, and the like.

In some embodiments, each of the first electrode 210 and the second electrode 220 may be electrically connected to any one of the scan line Si and the data line Dj. For example, when the first electrode 210 and the second electrode 220 are formed of the data metal forming the data line Dj, the first electrode 210 may be electrically connected to the scan line Si through a contact hole, and the second electrode 220 may be integrally formed with the data line Dj. For example, when the first electrode 210 and the second electrode 220 are formed of the gate metal forming the scan line Si, the first electrode 210 may be integrally formed with the scan line Si and the second electrode 220 may be electrically connected to the data line Dj through a contact hole. For example, when the first electrode 210 and the second electrode 220 are formed of a conductive material other than the gate metal and the data metal, the first electrode 210 and the second electrode 220 may be electrically connected to the scan line Si and the data line Dj through a first contact hole and a second contact hole, respectively.

In some embodiments, the first electrode 210 and/or the second electrode 220 may include at least one of a metal, an alloy thereof, a conductive polymer, and a conductive metal oxide. Examples of a metal capable of constituting the first electrode 210 and/or the second electrode 220 may be Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, and the like. In addition, various metals may be used as the metal capable of constituting the first electrode 210 and/or the second electrode 220.

Examples of an alloy capable of constituting the first electrode 210 and/or the second electrode 220 may be MoTi, AlNiLa, and the like. In addition, various alloys may be used as the alloy capable of constituting the first electrode 210 and/or the second electrode 220. Examples of a multi-layered layer capable of constituting the first electrode 210 and/or the second electrode 220 may be Ti/Cu, Ti/Au, Mo/Al/Mo, ITO/Ag/ITO, TiN/Ti/Al/Ti, TiN/Ti/Cu/Ti, and the like. In addition, various conductive materials having multi-layered structures may be used as the multi-layered layer capable of constituting the first electrode 210 and/or the second electrode 220. Examples of a conductive polymer capable of constituting the first electrode 210 and/or the second electrode 220 may be polythiophene-based, polypyrrole-based, polyaniline-based, polyacetylene-based, and polyphenylene-based compounds, mixtures thereof, and the like. Particularly, a PEDOT/PSS compound among the polythiophene-based compounds may be used as the conductive polymer capable of constituting the first electrode 210 and/or the second electrode 220. Examples of a conductive metal oxide capable of constituting the first electrode 210 and/or the second electrode 220 may be ITO, IZO, AZO, ITZO, ZnO, $SnO_2$, and the like. In addition, a material capable of providing conductivity as well as the above-described conductive materials may be used as the material constituting the first electrode 210 and/or the second electrode 220. The electrode structure of the first electrode 210 and/or the second electrode 220 is not particularly limited, and the first electrode 210 and/or the second electrode 220 may be variously formed in a single layer or multiple layers.

One or more bar type LEDs LD may be electrically connected between the first and second electrodes 210 and 220. For example, a plurality of bar type LEDs LD may be electrically connected between the first and second electrodes 210 and 220. That is, in the light emitting device according to the embodiment of the present disclosure, at least one bar type LED LD may be provided in each unit region, i.e., the individual pixel region EPA. Particularly, one or more bar type LEDs LD (in an embodiment, a plurality of bar type LEDs LD) electrically connected between the first and second electrodes 210 and 220 may be provided in the unit light emitting region EA of each pixel region EPA.

In some embodiments, the at least one bar type LED LD provided in each unit light emitting region EA may be electrically connected between the first and second electrodes 210 and 220 in a form in which one end of the bar type LED LD is physically and/or electrically in contact with the first electrode 210 and the other end of the bar type LED LD is physically and/or electrically in contact with the second electrode 220. In this case, as shown in FIG. 7, a length L of the bar type LED LD may be equal to or greater than a shortest distance D between the first and second electrodes 210 and 220 adjacent to each other.

In some embodiments, a conductive contact layer 250 may be additionally provided at both ends of the bar type LED LD. In this case, even when the side surface of the bar type LED LD is covered by the insulating film 14 as shown in FIG. 1, both ends of the bar type LED LD, which are not covered by the insulating film 14, may electrically connected to the respective first and second electrodes 210 and 220 by the conductive contact layer 250. In addition, when the conductive contact layer 250 is provided, the bar type LED LD can be prevented from being separated from its aligned position.

In an embodiment of the present disclosure, the number or scattering form of bar type LEDs LD connected between the first and second electrodes 210 and 220 is not particularly limited. In addition, although not shown in the drawings, at least one bar type LED that is not completely connected to the first and second electrodes 210 and 220 but randomly disposed between the first and second electrodes 210 and 220 may be further provided in each pixel region EPA. That is, at least one bar type LED LD that is not aligned but randomly disposed between the first and second electrodes 210 and 220 may be further provided in the unit light emitting region EA and/or the peripheral region PA.

In addition, for convenience, it has been illustrated in FIGS. 5 to 8 that the bar type LEDs LD connected between the first and second electrodes 210 and 220 are uniformly aligned in a specific direction (e.g., a direction in parallel to the data line Dj), but the alignment of the bar type LEDs LD is not limited thereto. For example, at least some of the bar type LEDs LD may be aligned in an oblique direction or the like between the first and second electrodes 210 and 220. That is, the connection direction and/or alignment direction, and the like of the bar type LEDs LD are not particularly limited.

In addition, the embodiments shown in FIGS. 5 to 8, for example, correspond to the pixel 142 having the structure shown in FIG. 3B, etc. When the structure of the pixel 142 is changed, the connection structure of the first electrode 210 and/or the second electrode 220 may be changed. For example, in some embodiments, the pixel circuit 144 shown in FIGS. 4A to 4C, etc. may be further provided in each pixel region EPA.

In some embodiments, the pixel circuit 144 may be provided, together with the first and second electrodes 210 and 220, on the same surface of the base substrate 200. In this case, the pixel circuit 144 may be disposed in the a same layer as the first and second electrodes 210 and 220, or may be disposed in a different layer from the first and second electrodes 210 and 220. For example, the pixel circuit 144 may be disposed in an intermediate layer (not shown) interposed between the insulating layer 201 and a predetermined layer in which the first and second electrodes 210 and 220 are disposed, to be electrically connected to the first electrode 210 and/or the second electrode 220 through a contact hole, a via hole, etc. In this case, the first electrode 210 and/or the second electrode 220 may be electrically connected to the pixel circuit 144 or the first or second pixel power source ELVDD or ELVSS, shown in FIGS. 4A to 4C, etc., instead of being connected to the scan line Si or the data line Dj.

In the light emitting device to which the bar type LEDs LD are applied, when assuming that the magnitudes of voltages between the first and second electrodes 210 and 220 in the respective pixel areas EPA are substantially equal to each other, the luminance of the individual pixel area EPA may be changed depending on the number of bar type LEDs LD electrically connected between the first and second electrodes 210 and 220, i.e., the number of effective bar type LEDs LD provided in the unit light emitting region EA of each pixel region EPA. Particularly, when a variation in number of effective bar type LEDs LD included in unit light emitting regions EA of pixel regions EPA is severe, the light emitting device may exhibit entirely non-uniform luminance characteristics.

Thus, in an embodiment of the present disclosure, there are provided a light emitting device and a fabricating method thereof, which can reduce a variation in luminance between pixel regions EPA and simultaneously improve visibility. Specifically, in the embodiment of the present disclosure, a dam 230 spaced apart from the barrier 240 to surround a predetermined unit light emitting region EA is formed in the individual pixel region EPA surrounded by the barrier 240. According to the embodiment of the present disclosure, it is possible to provide a light emitting device and a fabricating method thereof, in which amounts of an LED solution coated (or distributed) in the respective unit light emitting regions EA are controlled, thereby achieving uniform luminance characteristics and visibility.

More specifically, in an embodiment of the present disclosure, each unit light emitting region EA may be surrounded by the dam 230. In addition, a unit region including at least one unit light emitting region EA, i.e., each pixel region EPA may be surrounded by the barrier 240. That is, when viewed on a plane, an area of a region embraced by the dam 230 (i.e., a sectional area of the dam 230) may be smaller than an area of a region embraced by the barrier 240 (i.e., a sectional area of the barrier 240). That is, the dam 230 is disposed inside the barrier 240, and lateral and longitudinal lengths of the dam 230 may be smaller than those of the barrier 240.

Specifically, the dam 230 may be disposed to be spaced apart from the barrier 240 in each pixel region EPA at a predetermined distance. The dam 230 may be disposed at a boundary of unit light emitting regions EA each including one or more first and second electrodes 210 and 220 and one or more bar type LEDs LD. In some embodiments, an upper portion of the dam 230 is opened. For example, the dam 230 may be configured with a closed type sidewall of which at least one region has a flat or curved surface.

That is, the dam 230, as shown in FIG. 6, may be a three-dimensional structure having a predetermined height HE A capacity of the dam 230 may be determined by the height H1 of the dam 230 along with the sectional area of the dam 230 (i.e., the area of the unit light emitting region EA). Thus, the capacity of the dam 230 can be easily controlled by adjusting the area and/or height (H1) of the dam 230.

In some embodiments, the height H1 of the dam 230 may be equal to or greater than a height H2 of the barrier 240. For example, the height H1 of the dam 230 may be greater than the height H2 of the barrier 240. In this case, in a process of coating (or dropping), an LED solution in which a plurality of bar type LEDs LD are scattered in the LED solution, even when an excessive amount of the LED solution is coated (or dropped) in the pixel region EPA due to a variation in coating amount of a coating (or dropping) equipment, the excessive amount of the LED solution is overflown to a space between the dam 230 and the barrier 240.

However, in the present disclosure, it is not limited that the height H1 of the dam 230 is equal to or greater than the height H2 of the barrier 240. For example, if a total accommodation amount of each pixel region EPA by the dam 230 and the barrier 240 is large enough to accommodate a one-time coating (or dropping) amount or more of the LED solution, the height H1 of the dam 230 may be equal to or less than the height H2 of the barrier 240.

In some embodiments, when viewed on a plane, the dam 230 may have a closed type quadrangular shape as shown in FIG. 5. However, the shape of the dam 230 is not limited thereto, and may be variously modified.

For example, when viewed on a plane, the dam 230 may be implemented in a closed type polygonal shape. Alternatively, the dam 230 may be provided in various shapes such as a circle or an ellipse including curved sides, and a semicircle, a semi-ellipse, etc., including linear and curved sides. In some embodiments, when the dam 230 has linear sides, at least some of corners of each of the shapes may be formed in a curve. For example, as shown in FIG. 8, the dam 230 basically has a quadrangular shape, and at least some of corner portions at which adjacent linear sides meet each other may be rounded in a curved shape. That is, when viewed on a plane, the dam 230 may have a shape such as a closed type polygonal shape, a circular shape, or an elliptical shape, or may have various closed type shapes including a shape including linear and curved sides.

In some embodiments, the dam 230 may include one or more organic layers made of a photo resist (hereinafter, abbreviated as "PR") based organic material, etc. and/or one or more inorganic layers made of an inorganic material such as $SiN_x$ or $SiO_x$. For example, the dam 230 is configured in a multi-layered structure to include one or more organic layers and one or more inorganic layers, so that the height H1 of the dam 230 can be easily controlled.

Meanwhile, in some embodiments, when the dam 230 includes at least one inorganic layer, the dam 230 is fabricated using a sputtering process, so that the height H1 of the dam 230 can be precisely adjusted, for example, in the unit of nanometers (nm). Thus, the capacity of the dam 230 provided in each pixel region EPA can be easily controlled.

In some embodiments, at least a surface of the dam 230 may have hydrophilicity. For example, the dam 230 may be made of a hydrophilic material, or the surface of the dam 230 may include a hydrophilic film. In some embodiments, the hydrophilic material capable of constituting the dam 230 may be an inorganic insulating material such as $SiN_x$ or $SiO_x$, but the present disclosure is not limited thereto. For example, the hydrophilic material capable of constituting the dam 230 may be an organic insulating material. In addition, the dam 230 may be treated to have hydrophilicity using plasma, etc.

When the dam 230 has the hydrophilicity, if an LED solution of which amount is equal to or greater than the capacity of the dam 230 is coated (or dropped) in at least the unit light emitting region EA in the dam 230, the LED solution may easily overflow over the dam 230. That is, if the dam 230 has the hydrophilicity, a surface flatness of the LED solution accommodated in the dam 230 when the LED solution is fully filled in the dam 230 is maintained high.

By forming the hydrophilic dam 230 as described above, when an LED solution is coated in the unit light emitting region EA through an inkjet apparatus, a nozzle apparatus, or the like, it is possible to prevent a phenomenon that the LED solution piles up on the unit light emitting region EA. Thus, although a variation in coating or dropping amount of the LED solution occurs due to a variation in coating equipment, etc., only the LED solution of a certain amount can be accommodated in the dam 230.

In some embodiments, the barrier 240 may be disposed at a boundary of pixel regions EPA to surround each individual pixel region EPA. The barrier 240 may be spaced a predetermined distance apart from the dam 230. That is, each pixel region EPA may be defined by the barrier 240, and the barrier 240 may be a pixel defining layer PDL. The barrier 240 may serve as a bank structure when an LED solution is coated.

In some embodiments, when viewed on a plane, the barrier 240 may have a closed shape as shown in FIGS. 5 to 8. The barrier 240 may have an approximately quadrangular shape, but the present disclosure is not limited thereto. That is, like the shape of the dam 230, the shape of the barrier 240 may be variously modified.

In addition, the barrier 240, as shown in FIG. 6, may be a side closed type three-dimensional structure having a predetermined height H2. The height H2 of the barrier 240 may be equal to or different from the height H1 of the dam 230. For example, as described above, the height H2 of the barrier 240 may be equal to or less than the height of the dam 230 with respect to one surface (e.g., the upper surface) of the base substrate 200.

In some embodiments, at least a surface of the barrier may have hydrophobicity. For example, the barrier 240 may be made of a hydrophobic material, or the surface of the barrier 240 may include a hydrophobic film. In some embodiments, the hydrophobic material capable of constituting the barrier 240 may be a material containing fluorine, but the present disclosure is not limited thereto. For example, the hydrophobic material may be a polymer material having hydrophobic properties, e.g., a material obtained by mixing any one or two or more of polyimide, styrene, methylmathacrylate, and polytetrafluoroethylene, which contain fluorine. In some embodiments, the hydrophobic material may be a material containing fluorine to exhibit hydrophobicity. In some embodiments, the hydrophobic material may be applied in the form of a self-assembled monolayer (SAM) to the bar type LED LD. In this case, the hydrophobic material may include octadecyltrichlorosilane, fluoroalkyltrichlorosilane, perfluoroalkyltriethoxysilane, and the like. In addition, the hydrophobic material may be a commercialized fluorine-containing material such as Teflon™ or Cytop™, or a material corresponding thereto.

If the barrier 240 has the hydrophobicity, although an excessive amount of the LED solution is coated in the pixel region EPA due to a variation in coating equipment, etc. when the LED solution is coated in the pixel region EPA, the hydrophobic barrier 240 may prevent the excessive amount of the LED solution from being introduced into adjacent pixel regions EPA, etc.

As described above, in an embodiment of the present disclosure, the dams 230 disposed in the respective pixel regions EPA may have the substantially same capacity. Here, the term "substantially same" may mean that the dams 230 are designed or fabricated to have the same size or that sizes or capacities of the dams 230 are the same within a range including a variation belonging to an error occurs in a process. For example, the dams 230 disposed in the respective pixel regions EPA may be fabricated to have the same sectional area and height.

To this end, one or more dams 230 having the substantially same size may be disposed in each pixel region EPA, and the same number of dams 230 may be provided in each pixel region EPA. That is, in some embodiments, accommodation capacities of the one or more dams 230 provided in the pixel region EPA may be the substantially same for each of the pixel regions EPA.

Thus, according to the embodiment of the present disclosure, amounts of an LED solution coated in the unit light emitting regions EA of the respective pixel regions EPA can be controlled to be uniform. The amount of the LED solution coated in each unit light emitting region EA can be directly related to a number of bar type LEDs LD provided in the unit light emitting region EA.

Thus, according to the embodiment of the present disclosure, in a process of injecting or scattering bar type LEDs LD into the unit light emitting region EA of each pixel region EPA, an LED solution having a uniform amount can be injected into each unit light emitting region EA that is an effective light emitting region of each pixel region EPA. Accordingly, it is possible to provide a light emitting device that improves the coating (or distributing) uniformity of bar type LEDs LD, thereby achieving uniform luminance characteristics. Further, it is possible to provide a light emitting device that easily controls the coating (or distributing) region of bar type LEDs LD, thereby improving visibility.

Figure 9:
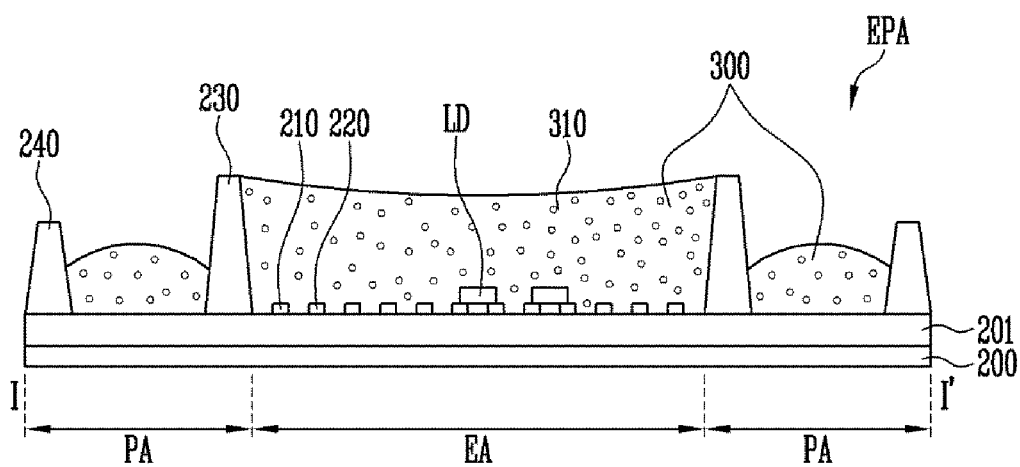
FIG. 9 is a plan view illustrating a unit region of a light emitting device according to an embodiment of the present disclosure, which illustrates an individual pixel region.

FIG. 9 is a plan view illustrating a unit region of a light emitting device according to an embodiment of the present disclosure, which illustrates an individual pixel region. In FIG. 9, components similar or identical to the above-described embodiment are designated by like reference numerals, and their detailed descriptions will be omitted.

Referring to FIG. 9, the light emitting device according to the embodiment of the present disclosure may further include a filler 300 provided in each pixel region EPA to fill in at least the dam 230, i.e., at least the unit light emitting region EA. In some embodiments, the filler 300 may include a plurality of scattering particles. For example, the filler 300 may include micro-particles 310 such as $TiO_2$ or silica.

According to the embodiment of the present disclosure, the dam 230 surrounding each unit light emitting region EA is provided, so that amounts of the filler 300 provided in the respective unit light emitting regions EA can be easily controlled. If the amounts of the filler 300 are controlled, the coating uniformity of scattering particles 310 coated or distributed in each unit light emitting region EA is improved, so that the visibility of the light emitting device can be entirely uniformalized.

Figure 10:
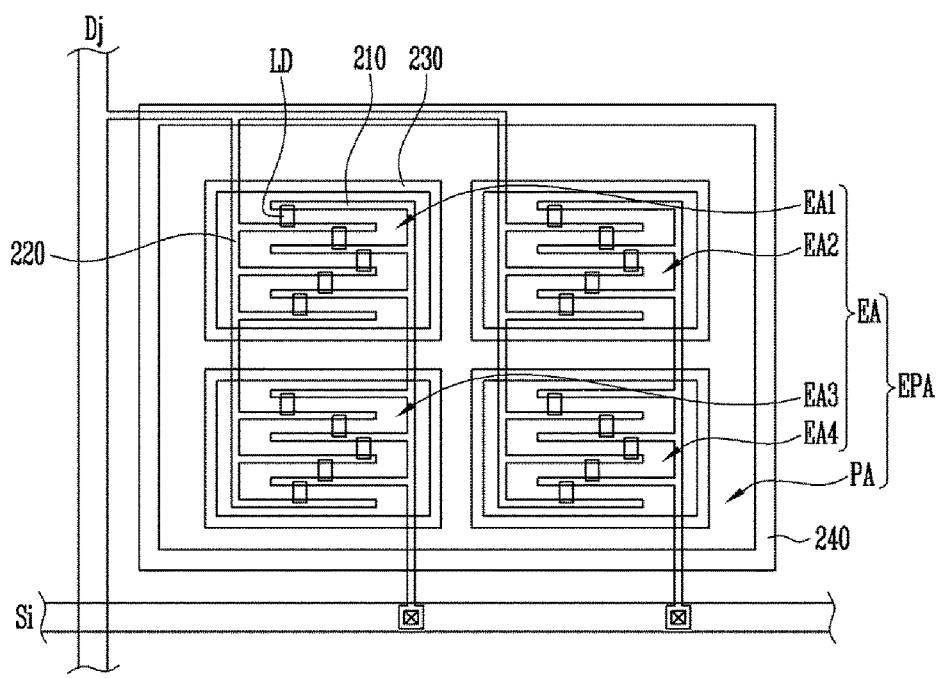
FIG. 10 is a plan view illustrating a unit region of a light emitting device according to an embodiment of the present disclosure, which illustrates an individual pixel region.

FIG. 10 is a plan view illustrating a unit region of a light emitting device according to an embodiment of the present disclosure, which illustrates an individual pixel region. In FIG. 10, components similar or identical to the above-described embodiment are designated by like reference numerals, and their detailed descriptions will be omitted.

Referring to FIG. 10, the light emitting device according to the embodiment of the present disclosure may include a plurality of dams 230 provided in a unit region, i.e., each pixel region EPA to be spaced apart from each other. For example, in an embodiment of the present disclosure, a plurality of unit light emitting regions, e.g., first to fourth unit light emitting regions EA1 to EA4, which are spaced apart from each other, may be provided in each pixel region EPA, and each of the first to fourth unit light emitting regions EA1 to EA4 may be surrounded by the dam 230.

That is, in an embodiment of the present disclosure, an effective light emitting region of the individual pixel region EPA may be divided into a plurality of unit light emitting regions EA1 to EA4 having a fine size. In this case, a capacity of each of the dams 230 surrounding the respective light emitting regions EA1 to EA4, for example, may be small as compared with the embodiment shown in FIG. 5.

According to the embodiment of the present disclosure, a variation in coating amount of an LED solution coated in the effective light emitting regions provided in each pixel region EPA, e.g., the first to fourth unit light emitting regions EA1 to EA4 can be further decreased. Specifically, the capacity of each dam 230 may be determined based on a size of the dam 230, i.e., a lateral length, a longitudinal length, and/or a height. In this case, a fabrication variation of the dam 230 may be proportional to a size of the dam 230. For example, the fabrication variation (fabrication variation in a process related to the lateral length, the longitudinal length, the height, etc.) of the dam 230 may be approximately 2% to 6% or so, which may be changed depending on a material used to form the dam 230, process conditions, etc. Thus, as the size or capacity of the dam decreases, the variation in amount of the LED solution accommodated in the dam 230 may also decrease.

For example, the dam 230 of which lateral length, longitudinal length, and height are 100 μm, 100 μm, and 3 μm, respectively, may have a capacity of 30 pl, the dam 230 of which lateral length, longitudinal length, and height are 50 μm, 50 μm, and 3 μm, respectively may have a capacity of 7.5 pl, and the dam 230 of which lateral length, longitudinal length, and height are 25 μm, 25 μm, and 3 μm, respectively may have a capacity of 1.875 pl. In this case, when assuming that a variation in size or capacity of the dam 230, which may occur in a fabricating process, is approximately 2%, a variation in capacity of the dam 230 having 30 pl may be about 0.6 pl, a variation in capacity of the dam 230 having 7.5 pl may be about 0.15 pl, and a variation in capacity of the dam 230 having 1.875 pl may be about 0.04 pl. That is, a variation in coating amount of the LED solution accommodated in each unit light emitting region EA (or EA1 to EA4) of each pixel region EPA may be determined according to the size of the dam 230 and/or the capacity of the dam 230. The variation in coating amount of the LED solution may be continued to a variation in number of bar type LEDs LD provided in each unit light emitting region EA (or EA1 to EA4). Thus, if the coating amount of the LED solution coated in each unit light emitting region EA (or EA1 to EA4) decreases by decreasing the size of the dam 230, the variation in number of bar type LEDs LD provided in the unit light emitting region EA (or EA1 to EA4) of individual pixel regions EPA decreases.

If the variation in the fabricating process increases, the variation in coating amount of the LED solution corresponding to the capacity of the dam 230 may further increase. For example, when the variation in the fabricating process may be approximately 6%, the variation in capacity of the dam 230 having 30 pl may be about 1.8 pl, a variation in capacity of the dam 230 having 7.5 pl may be about 0.45 pl, and a variation in capacity of the dam 230 having 1.875 pl may be about 0.11 pl. Thus, when assuming that the variation in the fabricating process is large, the capacity of the dam 230 may decrease, so that it is possible to remarkably improve luminance non-uniformity caused by a variation in number of bar type LEDs LD.

Meanwhile, in a light emitting device of a comparative example, in which the dam 230 is not provided, a coating amount of the LED solution coated in each pixel region EPA may be determined according to a capacity of the barrier 240 and/or a one-time coating amount of a coating equipment such as an inkjet head or nozzle. Therefore, the coating uniformity of the LED solution coated in each pixel region EPA may be in proportion to the one-time coating amount and a variation in coating equipment. In the light emitting device of the comparative example, in which the dam 230 is not provided, it is difficult to minutely control the coating amount of the LED solution coated in each pixel region EPA, as compared with the light emitting device according to the embodiment of the present disclosure. Hence, the one-time coating amount may be greater than an allowable amount. For example, when assuming that the variation in coating equipment is 5%, a variation in coating amount of the LED solution when the one-time coating amount of the LED solution is 50 pl may be 2.5 pl, and a variation in coating amount of the LED solution when the one-time coating amount of the LED solution is 80 pl may be 4.0 pl. That is, in the light emitting device of the comparative example, the variation in coating amount of the LED solution may be a remarkably large value as compared with the light emitting device according to the embodiment of the present disclosure. In order to decrease the variation in coating amount, it is advantageous to minimize the one-time coating amount of the LED solution, but there may be a limitation in minimizing the one-time coating amount of the LED solution due to a limitation of a size of the bar type LEDs LD and/or a coating equipment. For example, when a volume of each pixel region EPA defined by the barrier 240 is 60 pl, an available one-time coating amount of the LED solution may be approximately 50 pl to 80 pl, and there may be a limitation in decreasing the one-time coating amount of the LED solution to 50 pl or less due to the limitation of the size of the bar type LEDs LD and/or the coating equipment.

Therefore, in the light emitting device of the comparative example, a variation in number of effective bar type LEDs LD disposed in the unit light emitting region EA between pixel regions EPA may be large as compared with the light emitting device according to the embodiment of the present disclosure. Accordingly, the light emitting device of the comparative example exhibits non-uniform luminance characteristics.

That is, according to the above-described embodiments of the present disclosure, the dam 230 surrounding the unit light emitting region EA (or EA1 to EA4) is provided, so that the coating amount of the LED solution coated in each unit light emitting region EA (or EA1 to EA4) can be easily controlled. Accordingly, it is possible to provide a light emitting device having uniform luminance characteristics.

Figure 11A:
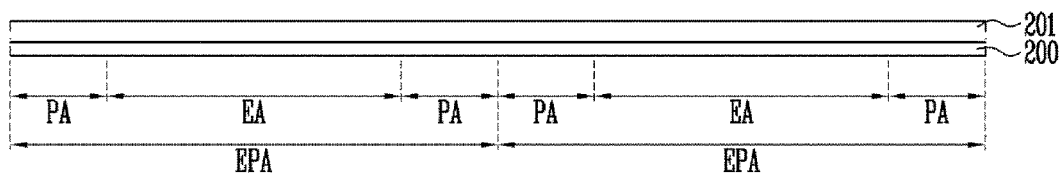
FIGS. 11A, 11B, 11C, 11D, 11E, 11F and 11G are sectional views sequentially illustrating a fabricating method of a light emitting device according to an embodiment of the present disclosure.

FIGS. 11A to 11G are sectional views sequentially illustrating a fabricating method of a light emitting device according to an embodiment of the present disclosure. FIGS. 12A and 12B are sectional views illustrating a coating amount of a bar type LED solution coated in an individual pixel region according to an embodiment of the present disclosure. For more clearly describing the present disclosure, a plurality of unit regions are illustrated in FIG. 11A, but, for convenience, only one unit region will be illustrated in FIGS. 11B to 11G. In FIGS. 11A to 12B, detailed descriptions of the above-described components will be omitted.

Referring to FIG. 11A, a base substrate 200 is first prepared. In some embodiments, an insulating layer 201 may be formed on one surface of the base substrate 200. In addition, a plurality of unit regions, e.g., respective pixel regions EPA are defined on the base substrate 200, and simultaneously, unit light emitting regions EA are defined in the pixel regions EPA. In some embodiments, one or more unit light emitting regions EA may be defined in each of the pixel regions EPA. Hereinafter, only one pixel region EPA will be described.

Figure 11B:
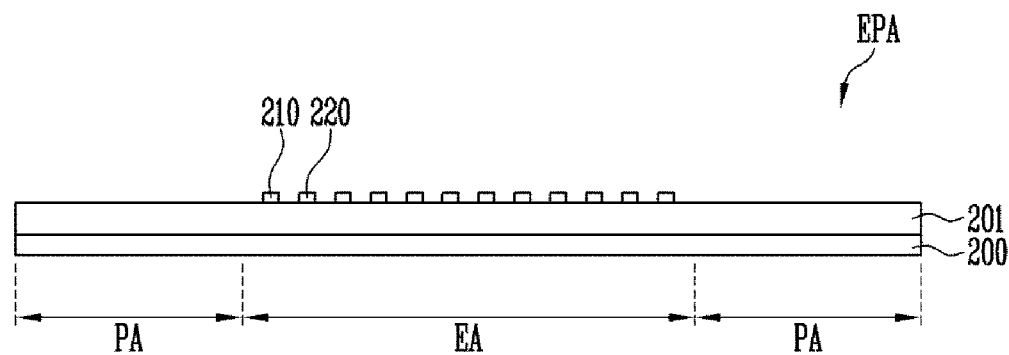
Figure 12A:
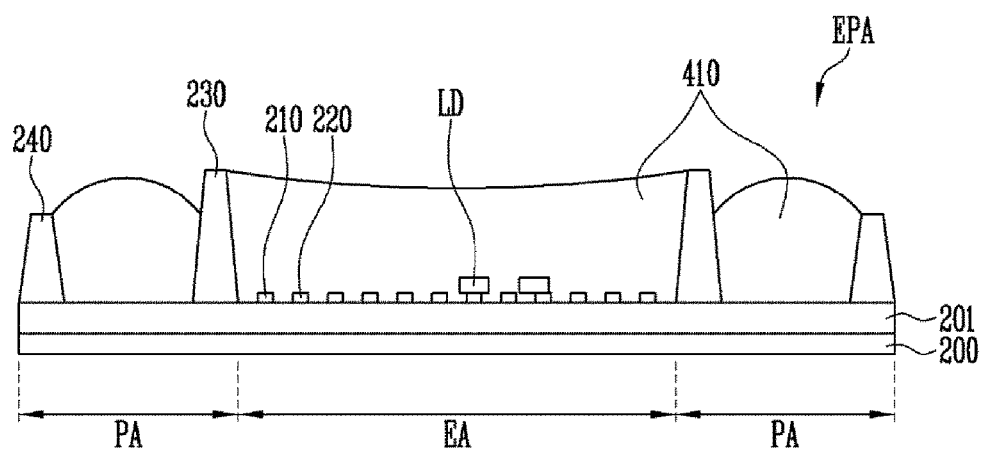
FIGS. 12A and 12B are sectional views illustrating a coating amount of a bar type LED solution coated in an individual pixel region according to an embodiment of the present disclosure.
Figure 12B:
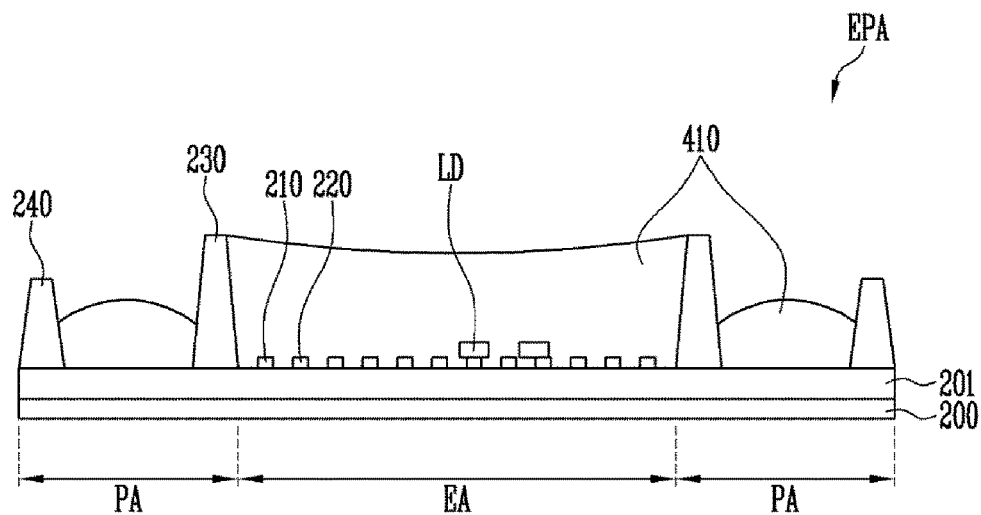

After that, as shown in FIG. 11B, at least one first electrode 210 and at least one second electrode 220 are formed in each of the unit light emitting regions EA. In some embodiments, the first electrode 210 and the second electrode 220 may be formed by forming and patterning a conductive layer on the one surface of the base substrate 200 on the insulating layer 201. In some embodiments, the first electrode 210 and the second electrode 220 may be simultaneously formed using the same conductive material, or may be sequentially formed using the same conductive material or different conductive materials.

Figure 11C:
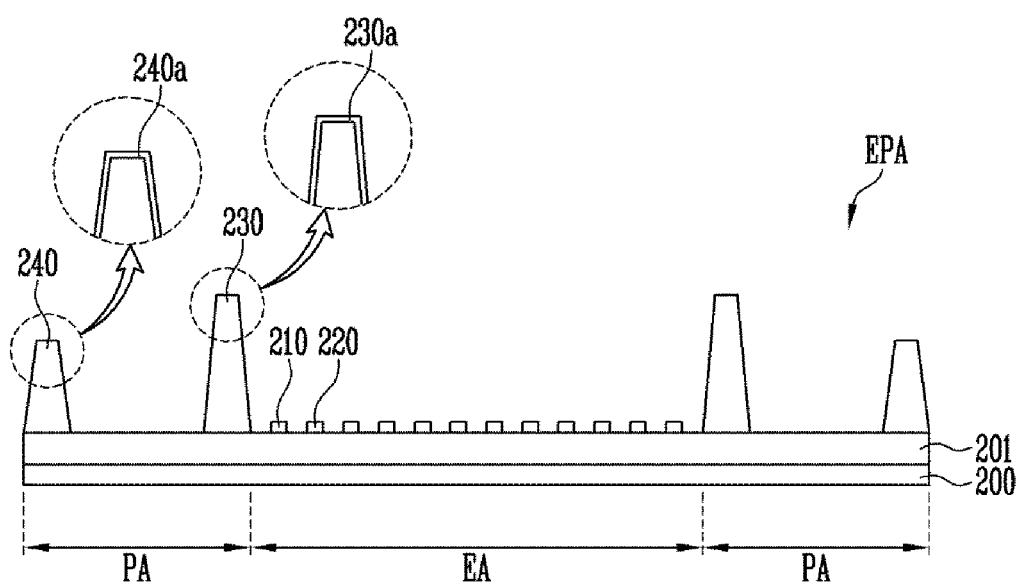

After that, as shown in FIG. 11C, a dam 230 surrounding each of the unit light emitting regions EA is formed, and a barrier 240 surrounding each of the pixel regions EA is formed at the outside of the unit light emitting regions EA to be spaced apart from the dam 230. In some embodiments, the dam 230 and the barrier 240 may be simultaneously formed, or may be sequentially formed. For example, the dam 230 may be formed first on the one surface of the base substrate 200 on which the first electrode 210 and the second electrode 220 are provided, and the barrier 240 may be formed after forming the dam 230. However, the barrier layer 240 may be formed first and the dam 230 may be formed after forming the barrier layer 240. Alternatively, in another embodiment, at least one organic layer and/or at least one inorganic layer, constituting the dam 230, may be formed, and simultaneously, at least one organic layer and/or at least one inorganic layer, constituting the barrier 240, may be formed.

In some embodiments, the forming of the dam 230 may include performing hydrophilic treatment on a surface of the dam 230 to form a hydrophilic film 230a. For example, the forming of the dam 230 may include forming a base pattern of the dam 230 by coating and patterning at least one of one or more inorganic layers and one or more organic layers on the base substrate 200, and forming a hydrophilic film 230a on the surface of the dam 230 by performing hydrophilic treatment on a surface of the base pattern.

In some embodiments, the forming of the barrier 240 may include performing hydrophobic treatment on a surface of the barrier 240. For example, the forming of the barrier 240 may include forming a base pattern of the barrier 240 by coating and patterning at least one of one or more inorganic layers and one or more organic layers on the base substrate 200, and forming a hydrophobic film 240a on the surface of the barrier 240 by performing hydrophobic treatment on a surface of the base pattern.

In some embodiments, the base pattern of the dam 230 and/or the barrier 240 may be formed through a sputtering process, a chemical vapor deposition (CVD) process, a dry etching process using plasma, a photo process, or the like. For example, when the dam 230 includes at least one inorganic layer, the inorganic layer may be formed through the sputtering process, so that a height (H1 of FIG. 6) of the dam 230 can be precisely controlled.

Figure 11D:
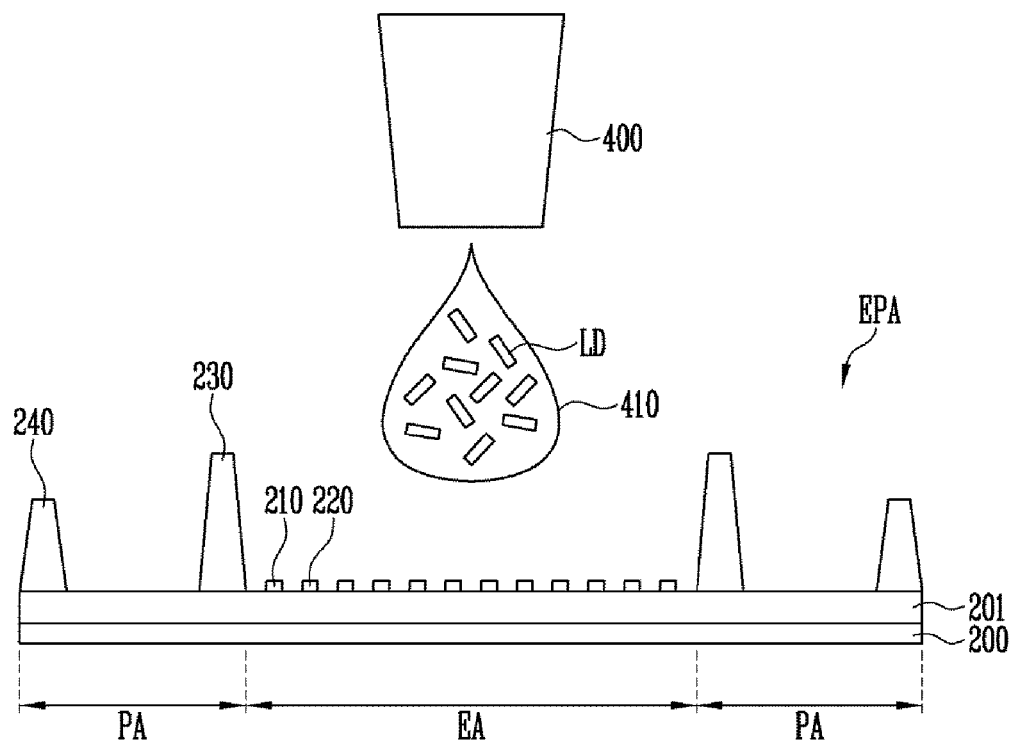

After that, as shown in FIG. 11D, a nozzle (or outlet) 400 of a coating equipment is disposed on each of the unit light emitting regions EA, and an LED solution 410 in which a plurality of bar type LEDs LD are dispersed is coated or dropped in the unit light emitting regions EA. Accordingly, the bar type LEDs LD may be injected into each of the unit light emitting regions EA. That is, in some embodiments, the bar type LEDs LD may be injected into each of the unit light emitting regions EA using an inkjet printing technique or the like. However, the method of injecting the bar type LEDs LD is not limited thereto. In some embodiments, the LED solution 410 may have an ink or paste phase. A solvent of the LED solution 410 may include a photo resist or organic layer containing the solvent, but the present disclosure is not limited thereto. In some embodiments, the solvent may be a volatile solvent.

Figure 11E:
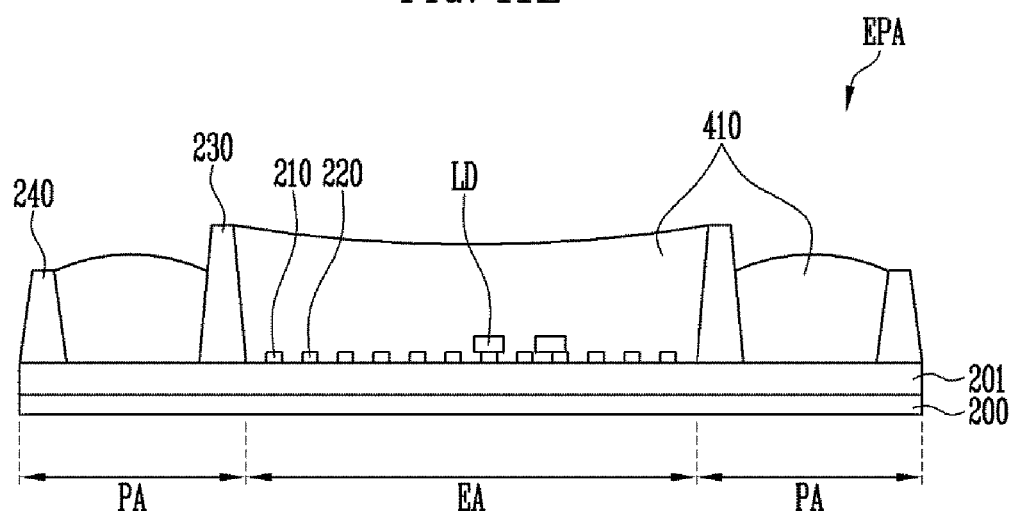

At this time, as shown in FIG. 11E, the LED solution 410 is coated to fully fill in at least each of the unit light emitting regions EA. That is, in an embodiment of the present disclosure, the LED solution 410 of which amount is equal to greater than a capacity of the dam 230 is coated in each of the pixel region EPA. Accordingly, the amount of the LED solution 410 coated in each of the unit light emitting regions EA can be controlled to be uniform.

In some embodiments, a one-time coating amount of the LED solution 410 may be set to be equal to or greater than the capacity of the dam 230, and may be set to be equal to or less than a total accommodation amount of the individual pixel region EPA (a total accommodation amount by the dam 230 and the barrier 240). For example, when the capacity of the dam 230 is 10 pl, and the total accommodation amount of the individual pixel region EPA is 60 pl, the one-time coating amount of the LED solution 410 may be set to 10 pl to 60 pl.

For example, in some embodiments, as shown in FIG. 12A, the LED solution 410 of which capacity approximately corresponds to the total accommodation amount of the individual pixel region EPA may be coated to fully fill in the individual pixel region EPA. Here, if the barrier 240 has hydrophobicity, the LED solution 410 can be prevented to a certain degree from overflowing into an adjacent pixel region EPA, etc. Meanwhile, in some embodiments, as shown in FIG. 12B, the LED solution 410 of which amount is smaller than the total accommodation amount of the individual pixel region EPA may be coated. At this time, if the coating amount of the LED solution 410 is equal to or greater than the capacity of the dam 230, only the LED solution 410 having a certain amount corresponding to the capacity of the dam 230 is coated or accommodated. That is, according to the embodiment of the present disclosure, although a variation in coating amount of the LED solution 410 occurs, the amount of the LED solution 410 coated in each of the unit light emitting region EA can be controlled to be uniform.

Figure 11F:
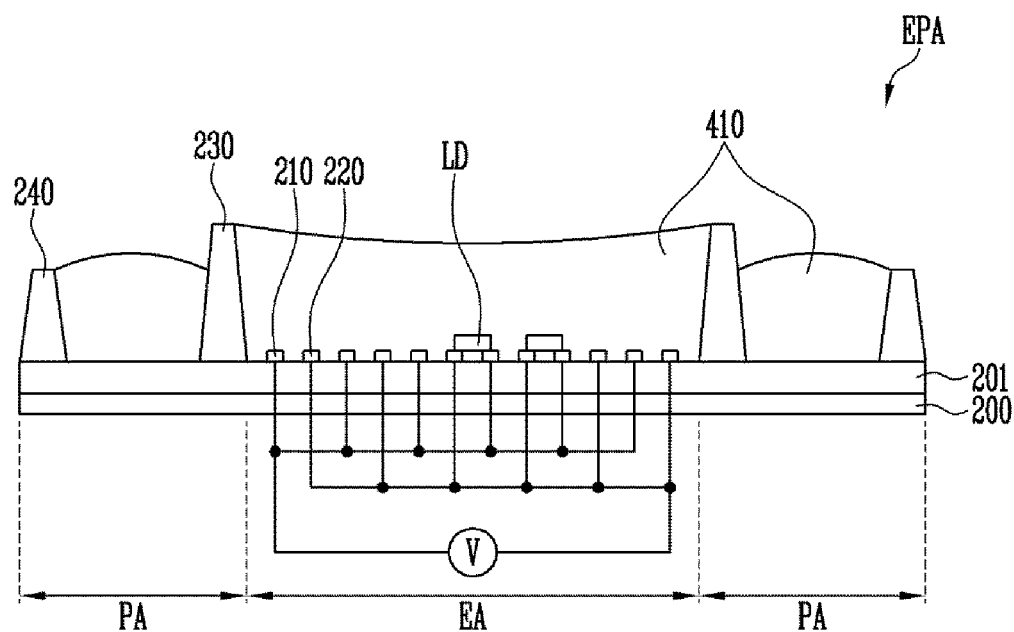

After the LED solution 410 is coated in each of the pixel region EPA or at the same time when the LED solution 410 is coated, an electric field is induced by applying a voltage between the first electrode 210 and the second electrode 220 as shown in FIG. 11F. Accordingly, the bar type LEDs LD that are randomly dispersed in the LED solution 410 may be aligned. For example, as a DC or AC voltage is applied between the first electrode 210 and the second electrode 220, self-alignment of at least one bar type LED LD injected in the unit light emitting region EA may be occurred such that both ends of the bar type LED LD are located on the first electrode 210 and the second electrode 220, respectively. More specifically, if a voltage is applied to the first electrode 210 and the second electrode 220, bipolarity is induced to the bar type LED LD by an electric field formed between the first electrode 210 and the second electrode 220. Accordingly, the bar type LED LD is self-aligned between the first electrode 210 and the second electrode 220.

Figure 11G:
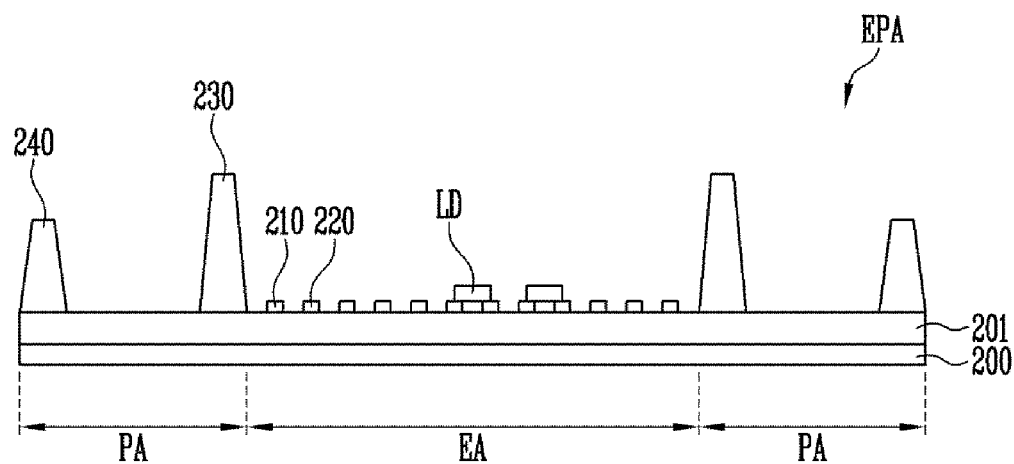

After that, as the solvent of the LED solution 410 is removed, a light emitting device may be fabricated as shown in FIG. 11G In a non-restrictive embodiment in which the solvent of the LED solution 410 is removed, the solvent of the LED solution 410 may be removed by using a solvent of a volatile material and volatilizing the solvent.

Meanwhile, in some embodiments, the light emitting device may further include a filter 300 in which a plurality of scattering particles 310 are scattered as shown in FIG. 9. In this case, after the solvent of the LED solution 410 is removed, coating (or dropping) of the filter 300 including the scattering particles 310 in the pixel regions EPA may be further performed.

At this time, the filler 300 of which amount is equal to or greater than the capacity of at least the dam 230 is coated in each of the pixel regions EPA, so that it is possible to control amounts of the filler 300 provided in the respective unit light emitting regions EA to be uniform and to improve the visibility of the light emitting device.

Figure 13A:
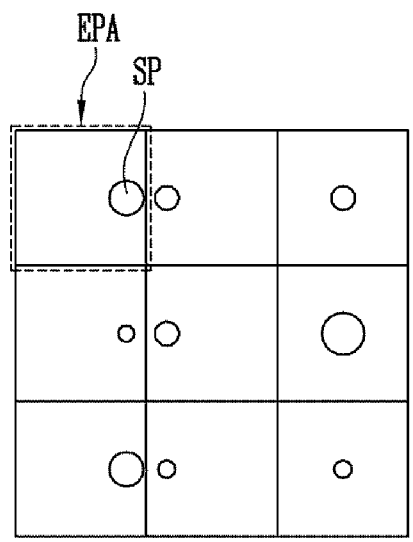
FIGS. 13A and 13B are plan views illustrating a luminance uniformity effect according to an embodiment of the present disclosure.
Figure 13B:
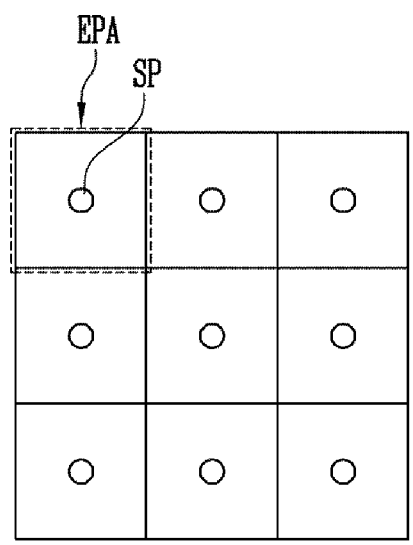

FIGS. 13A and 13B are plan views illustrating a luminance uniformity effect according to an embodiment of the present disclosure. More specifically, FIG. 13A illustrates one region of the light emitting device of the comparative example, and FIG. 13B illustrates one region of the light emitting device according to the embodiment of the present disclosure. For convenience, in FIG. 13A, positions having the highest luminance and relative sizes of the luminances are represented as positions and size of circles, respectively.

Referring to FIG. 13A, in the light emitting device of the comparative example, in which the dam 230 is not provided, positions having the highest luminance, i.e., positions SP at which bar type LEDs LD are concentrated, are randomly distributed. Also, in the light emitting device of the comparative example, non-uniform luminance characteristics are shown for each pixel region EPA.

On the other hand, as described above, in the light emitting device according to the embodiment of the present disclosure, the dam 230 is formed in each of the pixel regions EPA, so that it is possible to easily control the region in which the effective bar type LEDs LD capable of emitting light by being aligned between the first and second electrodes 210 and 220, and to control the density of the effective bar type LEDs LD to be uniform. Thus, in the light emitting device according to the embodiment of the present disclosure, as shown in FIG. 13B, positions having the highest luminance, i.e., the positions SP at which the bar type LEDs LD are concentrated, are controlled to be uniform, and uniform luminance characteristics are shown without any large variation of luminance for each pixel region EPA.

According to the present disclosure, it is possible to control luminance characteristics to be uniform and to improve visibility of the light emitting device including the bar type LEDs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A light emitting device comprising:
a base substrate; and
a plurality of pixel regions on the base substrate, each of the pixel regions comprising:
a light emitting region, the light emitting region comprising a plurality of LEDs;
a barrier on the base substrate and defining the each of the pixel regions;
a dam on the base substrate to be spaced apart from the barrier, the dam being disposed in the each of the pixel regions to surround the light emitting region;
a plurality of first electrode lines disposed in the light emitting region; and a plurality of second electrode lines disposed in the light emitting region, each of the second electrode lines spaced apart from each of the first electrode lines, wherein at least one of the LEDs is electrically connected to one of the first electrode lines and one of the second electrode lines.

2. The light emitting device of claim 1, wherein at least a surface of the dam has hydrophilicity.

3. The light emitting device of claim 1, wherein at least a surface of the barrier has hydrophobicity.

4. The light emitting device of claim 1, wherein a height of the dam is equal to or greater than that of the barrier.

5. The light emitting device of claim 1, comprising:
a plurality of dams disposed in each of the pixel regions, respectively,
wherein the dams have the same height.

6. The light emitting device of claim 1, wherein the dam is configured as a closed sidewall of which at least one region has a flat or curved surface.

7. The light emitting device of claim 1, wherein the LEDs are bar type LEDs, a length of each of the bar type LEDs is equal to or greater than a shortest distance between one of the first electrode lines and a corresponding one of the second electrode lines, and one end and the other end of each of the bar type LEDs are electrically in contact with corresponding ones of the first and second electrode lines, respectively.

8. The light emitting device of claim 1, further comprising a filler provided in each of the pixel regions to fill in at least the dam, the filler including a plurality of scattering particles.

9. The light emitting device of claim 1, wherein plurality of dams spaced apart from one another are provided in each of the pixel regions.

10. A light emitting display device comprising:
a base substrate; and
a plurality of pixels disposed on the base substrate, each of the pixels comprising:
a light emitting region on the base substrate;
a barrier on the base substrate to surround the light emitting region;
a dam on the base substrate to be spaced apart from the barrier, the dam being disposed to surround the light emitting region;
a first electrode line disposed in the light emitting region;
a second electrode line disposed in the light emitting region, the second electrode line being spaced apart from the first electrode line; and
a plurality of LEDs disposed in the light emitting region, at least one of the LEDs being electrically connected to the first electrode line and the second electrode line.

11. A method of fabricating a light emitting device, the method comprising:
preparing a base substrate, the base substrate including a plurality of pixel regions and a plurality of light emitting regions in the pixel regions;
forming a plurality of first electrode lines and a plurality of second electrode lines in each of the light emitting regions;
forming a dam and a barrier surrounding each of the light emitting regions, the barrier surrounding the dam, being spaced a predetermined distance apart from the dam and defining each of the pixel regions; and
coating an LED solution in which a plurality of LEDs are dispersed in the pixel regions to fill in at least the light emitting regions.

12. The method of claim 11, wherein the LEDs are bar type LEDs, and
wherein, in the coating of the LED solution, the LED solution of which amount is equal to or greater than a capacity of the dam is coated in each of the pixel regions.

13. The method of claim 12, wherein, in the coating of the LED solution, the LED solution of which amount is equal to or less than a total accommodation amount by the dam and the barrier is coated in the each of the pixel regions.

14. The method of claim 11, wherein the LEDs are bar type LEDs, and
wherein the forming of the dam and the forming of the barrier are sequentially performed.

15. The method of claim 14, wherein the forming of the dam includes:
forming a base pattern of the dam by coating and patterning at least one of one or more inorganic layers and one or more organic layers on the base substrate; and
performing hydrophilic treatment on a surface of the base pattern.

16. The method of claim 15, wherein the forming of the base pattern includes forming at least one inorganic layer on the base substrate using a sputtering process.

17. The method of claim 14, wherein the forming of the barrier includes:
forming a base pattern of the barrier by coating and patterning at least one of one or more inorganic layers and one or more organic layers on the base substrate; and
performing hydrophobic treatment on a surface of the base pattern.

18. The method of claim 11, further comprising inducing an electric field between the first electrode lines and the second electrode lines while the coating of the LED solution or after the coating of the LED solution,
wherein the LEDs are bar type LEDs.

19. The method of claim 11, further comprising removing a solvent of the LED solution,
wherein the LEDs are bar type LEDs.

20. The method of claim 11, further comprising coating a filler including a plurality of scattering particles in each of the pixel regions,
wherein the LEDs are bar type LEDs.

21. The method of claim 20, wherein, in the coating of the filler, the filler of which amount is equal to or greater than the capacity of at least the dam is coated in each of the pixel regions.

* * * * *